US012610635B2

(12) United States Patent
Ichikawa et al.

(10) Patent No.: US 12,610,635 B2
(45) Date of Patent: Apr. 21, 2026

(54) X-RAY DETECTION DEVICE

(71) Applicant: HAMAMATSU PHOTONICS K.K., Hamamatsu (JP)

(72) Inventors: Minoru Ichikawa, Hamamatsu (JP); Kazuki Fujita, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 246 days.

(21) Appl. No.: 18/039,556

(22) PCT Filed: Sep. 8, 2021

(86) PCT No.: PCT/JP2021/032980
§ 371 (c)(1),
(2) Date: May 31, 2023

(87) PCT Pub. No.: WO2022/137662
PCT Pub. Date: Jun. 30, 2022

(65) Prior Publication Data
US 2023/0420465 A1 Dec. 28, 2023

(30) Foreign Application Priority Data
Dec. 24, 2020 (JP) ................................. 2020-215429

(51) Int. Cl.
*G01T 1/24* (2006.01)
*H10F 39/00* (2025.01)
*H10F 39/18* (2025.01)

(52) U.S. Cl.
CPC ......... *H10F 39/8023* (2025.01); *G01T 1/241* (2013.01); *H10F 39/189* (2025.01)

(58) Field of Classification Search
CPC ..................................................... G01T 1/241
See application file for complete search history.

(56) References Cited

U.S. PATENT DOCUMENTS

| | | | |
|---|---|---|---|
| 5,625,665 A | 4/1997 | Fokkink et al. | |
| 8,120,683 B1 * | 2/2012 | Tumer ................... | H04N 23/30 348/295 |

(Continued)

FOREIGN PATENT DOCUMENTS

| | | |
|---|---|---|
| CN | 1864062 A | 11/2006 |
| CN | 102636950 A | 8/2012 |

(Continued)

OTHER PUBLICATIONS

International Preliminary Report on Patentability mailed Jul. 6, 2023 for PCT/JP2021/032980.

(Continued)

*Primary Examiner* — David J Makiya
*Assistant Examiner* — Shun Lee
(74) *Attorney, Agent, or Firm* — Faegre Drinker Biddle & Reath LLP

(57) ABSTRACT

An X-ray detection device includes a capillary, an X-ray detection element, and a detection circuit. The capillary has a plurality of X-ray passing regions. The X-ray detection element has a conversion portion and a plurality of pixel electrode portions. The conversion portion faces the capillary and absorbs X-rays to generate carriers. The detection circuit detects carriers collected from the conversion portion through the plurality of pixel electrode portions. When a plurality of carriers generated by incidence of an X-ray are dispersed and collected in two or more of the pixel electrode portions, the detection circuit determines one of the pixel electrode portions corresponding to an X-ray incidence position and corrects and evaluates an amount of carriers in the one of the pixel electrode portions or ignores the incidence of the X-ray.

16 Claims, 23 Drawing Sheets

(56) References Cited

U.S. PATENT DOCUMENTS

| | | | | |
|---|---|---|---|---|
| 10,254,163 B1 * | 4/2019 | Cherlin | .................... | G01J 1/44 |
| 2004/0251419 A1 | 12/2004 | Nelson et al. | | |
| 2011/0218432 A1 * | 9/2011 | Tumer | .................... | A61B 6/00 |
| | | | | 250/363.01 |

FOREIGN PATENT DOCUMENTS

| | | |
|---|---|---|
| JP | 2000-055842 A | 2/2000 |
| JP | 2003-329622 A | 11/2003 |
| JP | 2004-089445 A | 3/2004 |
| JP | 2016-534374 A | 11/2016 |
| WO | WO-2015/058702 A1 | 4/2015 |
| WO | WO-2015/087663 A1 | 6/2015 |

OTHER PUBLICATIONS

Ballabriga, R. et al., "The Medipix3RX: a high resolution, zero dead-time pixel detector readout chip allowing spectroscopic imaging," IOPScience, Feb. 8, 2013.

Deptuch, Grzegorz W. et al., "An Algorithm of an X-ray Hit Allocation to a Single Pixel in a Cluster and Its Test-Circuit Implementation," IEEE Transactions on Circuits and Systems, vol. 65, Issue 1, pp. 185-197, Jan. 2018.

Veale, Matthew C. et al., "An ASIC for the Study of Charge Sharing Effects in Small Pixel CdZnTe X-Ray Detectors," IEEE Transactions on Nuclear Science, Nov. 2011.

* cited by examiner (a)

(b)

(a)

(b)

(a)   P1

(b)   P2

(c)   P3

(d)   P4

(e)   P5

(f)   P6

(g)   P7

(h)   P8

(i)   P9

(j)   P10

X-RAY DETECTION DEVICE

TECHNICAL FIELD

The present disclosure relates to an X-ray detection device.

BACKGROUND ART

Patent Literature 1 discloses a technique related to an X-ray imaging apparatus. The X-ray imaging apparatus includes beam irradiation means, imaging means, angular divergence limiting means, and X-ray image display means. The beam irradiation means irradiates the surface of a substance with any one of X-rays, particle beams, and ion beams. The imaging means has sensitivity to wavelengths in the X-ray region. The angular divergence limiting means controls the angular divergence of X-rays incident on the imaging means. The X-ray image display means displays an X-ray image captured by the imaging means. In the X-ray imaging apparatus, fluorescent X-rays and scattered X-rays generated by irradiating the substance with beams are imaged by the imaging means, and the captured image is displayed as a moving image on the X-ray image display means.

Patent Literature 2 discloses a technique related to a two-dimensional photon counting element. The two-dimensional photon counting element specifies a photon incidence position even when a plurality of carriers generated by the incidence of photons are dispersed and collected in a plurality of pixel electrode portions.

CITATION LIST

Patent Literature

Patent Literature 1: Japanese Unexamined Patent Publication No. 2003-329622
Patent Literature 2: International Publication WO 2015/87663

Non Patent Literature

Non Patent Literature 1: R. Ballabriga et al., "The Medipix3RX: a high resolution, zero dead-time pixel detector readout chip allowing spectroscopic imaging", IOP Science, Feb. 8, 2013
Non Patent Literature 2: Grzegorz W. Deptuch et al., "An algorithm of an X-ray Hit allocation to a single pixel in a cluster and Its test-circuit implementation", IEEE Transactions on Circuits and Systems, Volume 65, Issue 1, pp. 185-197, Jan 2018
Non Patent Literature 3: Matthew C. Veale, Matthew David Wilson, Steven James Bell, and Dimitris Kitou, "An ASIC for the Study of Charge Sharing Effects in Small Pixel CdZnTe X-Ray Detectors", IEEE Transactions on Nuclear Science, November 2011

SUMMARY OF INVENTION

Technical Problem

There is an X-ray detection element having a conversion portion that absorbs an X-ray incident from the front surface side to generate carriers and a plurality of pixel electrodes arranged on the back surface of the conversion portion. In order to improve the image quality obtained by such an X-ray detection element, a capillary such as a capillary plate may be arranged so as to face the front surface of the X-ray detection element. The capillary referred to herein is a member having a plurality of X-ray passing regions, for example, a plurality of holes, which pass through the X-ray shielding region. By making the central axes of the plurality of X-ray passing regions parallel to each other, only the parallel components of the X-ray can be made to pass through the X-ray passing regions to improve the image quality.

In this case, it has been generally believed that, as the inner diameters of the plurality of X-ray passing regions of the capillary become smaller than the pixel electrodes of the X-ray detection element, the spatial resolution becomes smaller, and accordingly, a clearer image can be obtained. However, the research by the inventors showed that this was not necessarily true. A gap is always provided between adjacent pixel electrodes in order to electrically insulate the pixel electrodes from each other. The smaller the inner diameter of the X-ray passing region of the capillary, the more frequently the X-ray passing region is arranged on the gap. A plurality of carriers generated by an X-ray passing through the X-ray passing region arranged on the gap are dispersed and collected in two pixel electrodes located on both sides of the gap. This phenomenon is called charge share. As a result, the X-ray incidence position becomes ambiguous and the energy resolution is lowered, which is one of the causes of blurring of the image.

It is an object of the present disclosure to suppress blurring of an image due to charge share in an X-ray detection device including an X-ray detection element and a capillary.

Solution to Problem

An X-ray detection device according to one aspect of the present disclosure includes at least one capillary, at least one X-ray detection element, and at least one detection circuit. The capillary has a first surface, a second surface facing away from the first surface, a plurality of X-ray passing regions, and an X-ray shielding region. The plurality of X-ray passing regions penetrate from the first surface to the second surface. The X-ray shielding region is arranged between the plurality of X-ray passing regions. The X-ray detection element has a conversion portion and a plurality of pixel electrode portions. The conversion portion has a third surface facing the second surface of the capillary and a fourth surface facing away from the third surface. The conversion portion absorbs an X-ray to generate carriers. The plurality of pixel electrode portions are arranged in a two-dimensional manner on the fourth surface of the conversion portion. The detection circuit detects carriers collected from the conversion portion through the plurality of pixel electrode portions. An inner diameter of each of the X-ray passing regions when viewed from an X-ray incidence direction is smaller than a width of each of the pixel electrode portions in an arrangement direction when viewed from the same direction. When a plurality of carriers generated by incidence of an X-ray are dispersed and collected in two or more of the pixel electrode portions, the detection circuit determines one pixel electrode portion corresponding to an X-ray incidence position among the plurality of pixel electrode portions and corrects and evaluates an amount of carriers in the one of the pixel electrode portion or ignores the incidence of the X-ray.

Advantageous Effects of Invention

According to the present disclosure, it is possible to suppress blurring of an image due to charge share in an X-ray detection device including an X-ray detection element and a capillary.

Figure 8:
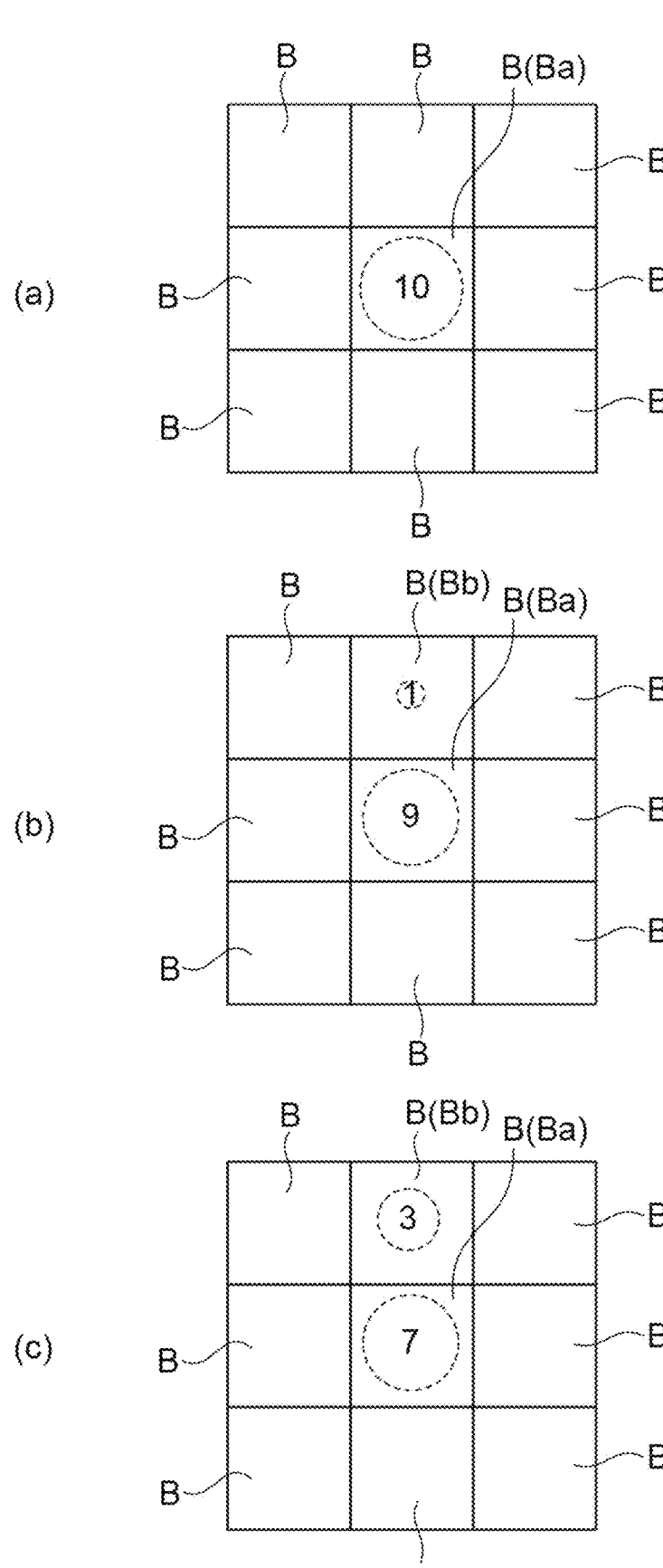

(a), (b), and (c) of FIG. 8 are diagrams for explaining a method of ignoring the incidence of an X-ray when two or more pixel electrode portions in which carriers of an amount exceeding a threshold value are collected are present at the same time.

Figure 9:
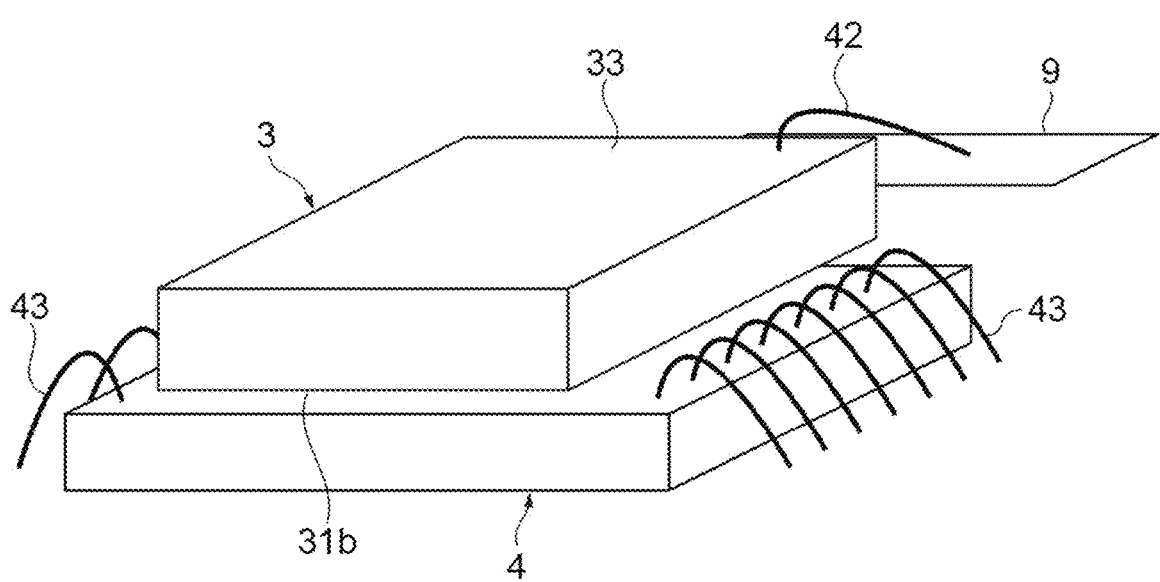

FIG. 9 is a perspective view showing an X-ray detection element and a semiconductor integrated element.

Figure 10:
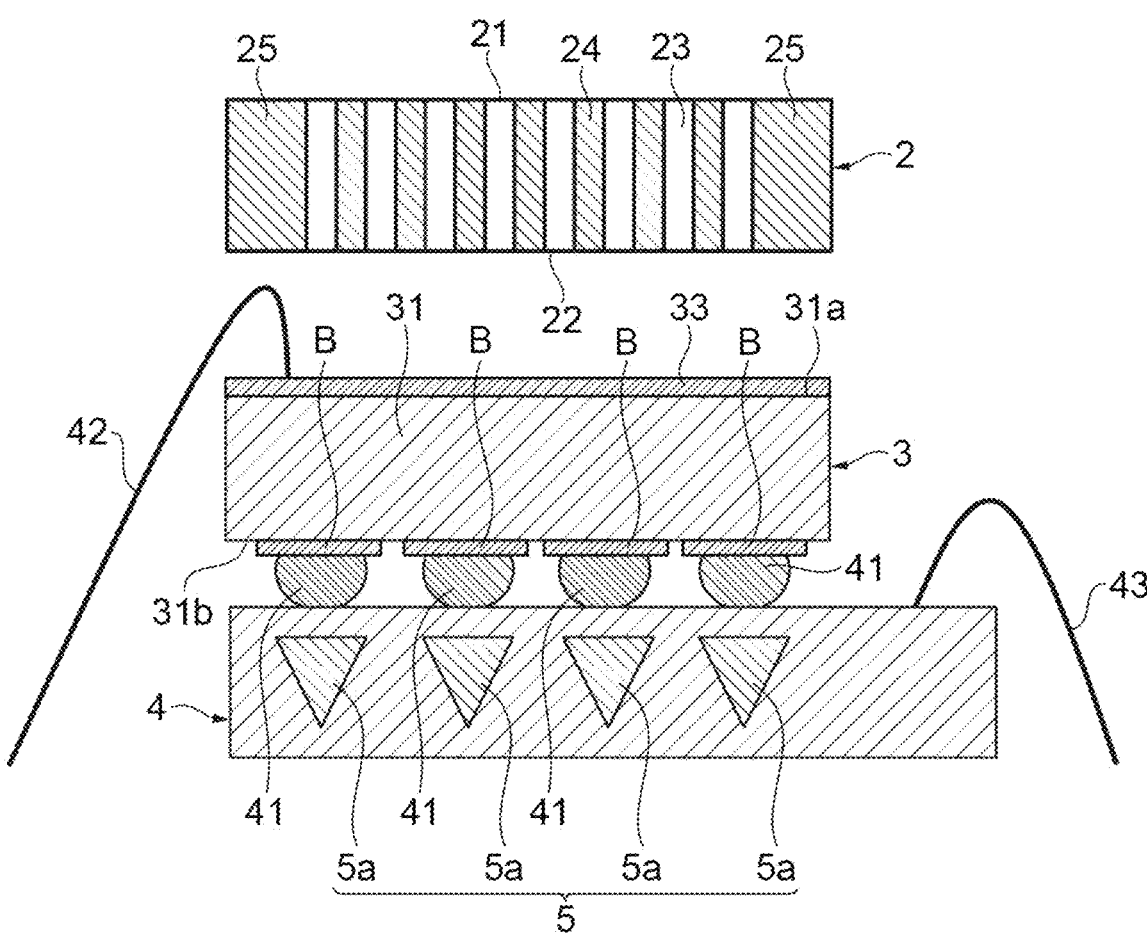

FIG. 10 is a cross-sectional view schematically showing the arrangement of a capillary plate, an X-ray detection element, and a semiconductor integrated element.

Figure 11:
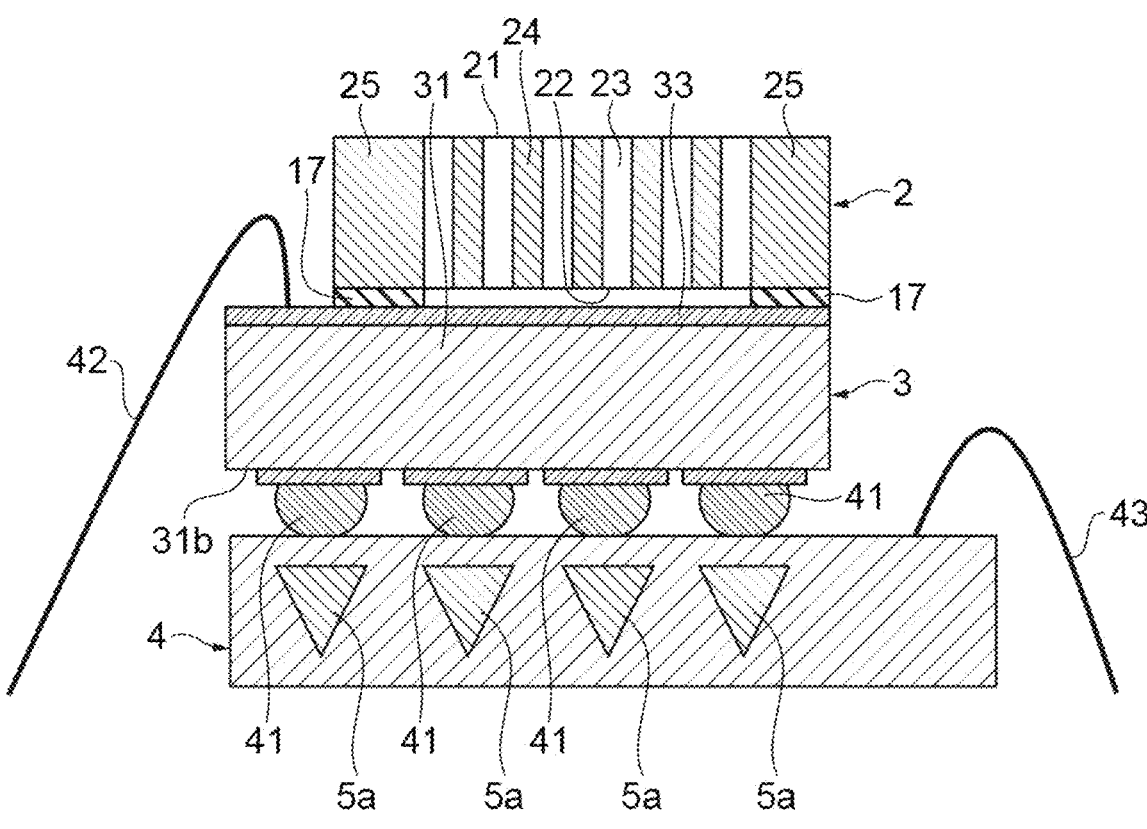

FIG. 11 is a diagram schematically showing a configuration according to a first modification example.

Figure 12:
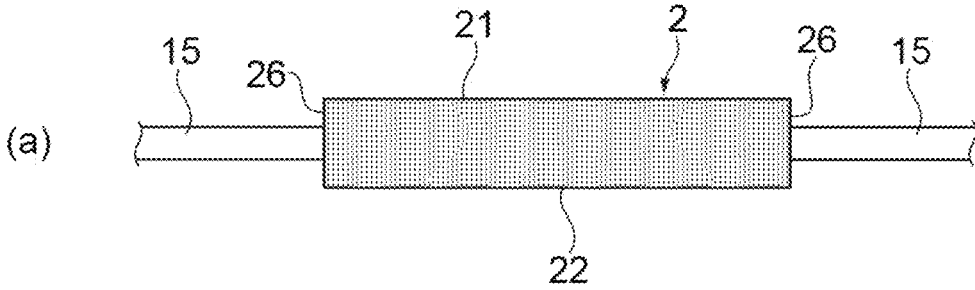
Figure 12:
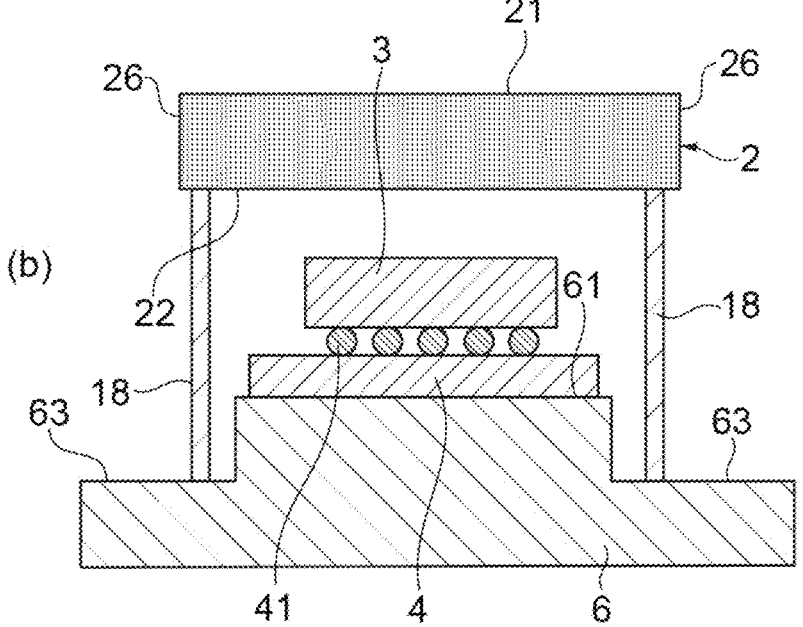

(a) of FIG. 12 is a diagram schematically showing a configuration according to a second modification example. (b) of FIG. 12 is a diagram schematically showing a configuration according to a third modification example.

Figure 13:
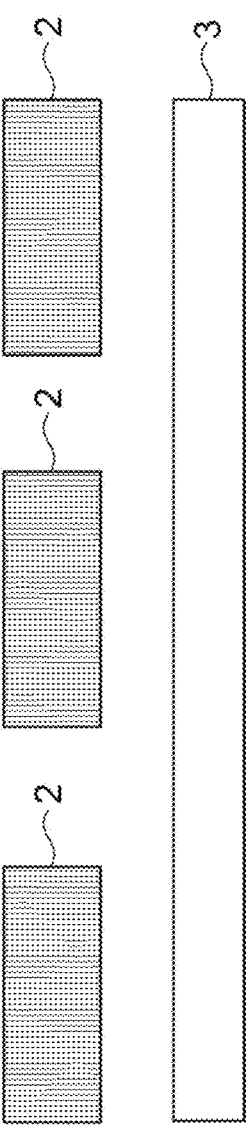

FIG. 13 is a diagram schematically showing a configuration according to a fourth fifth modification example.

Figure 14:
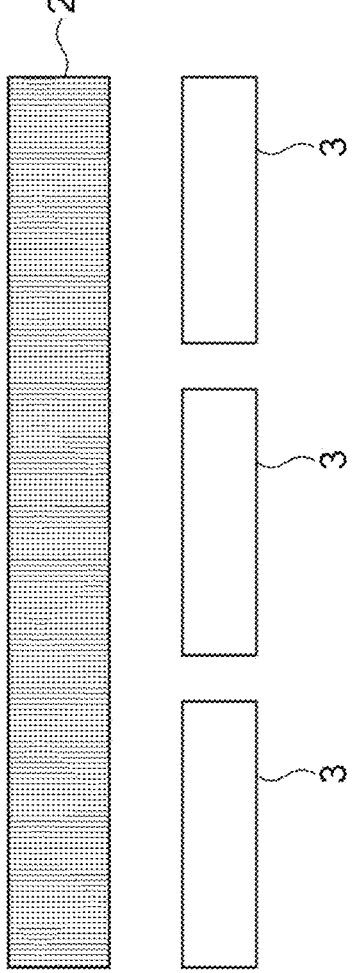

FIG. 14 is a diagram schematically showing a configuration according to a fourth modification example.

Figure 15:
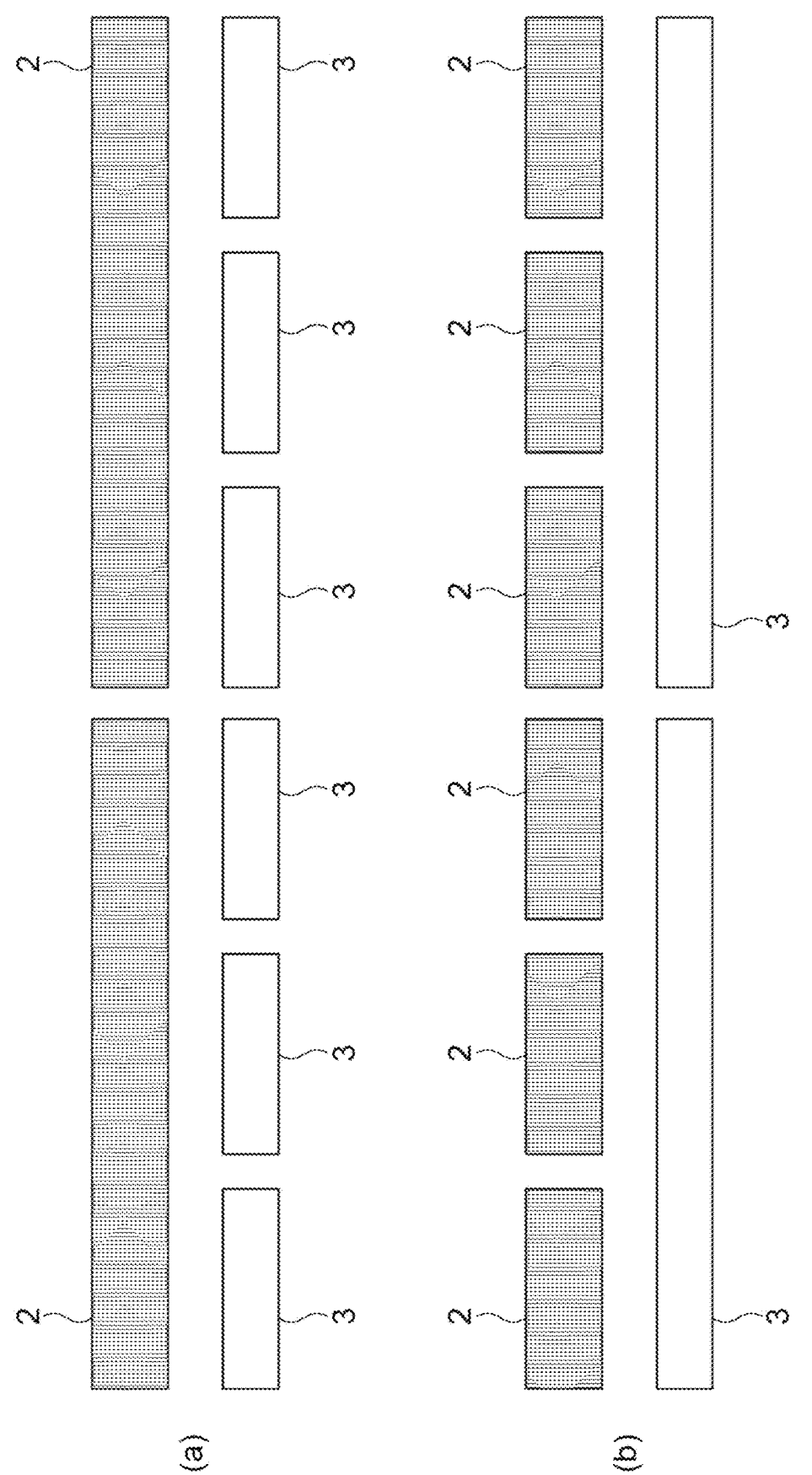

FIG. 15 is a diagram schematically showing a configuration according to a sixth modification example. (a) of FIG. 15 is a diagram showing an example in which a plurality of X-ray detection elements face one capillary plate. (b) of FIG. 15 is a diagram showing an example in which one X-ray detection element faces a plurality of capillary plates.

Figure 16:
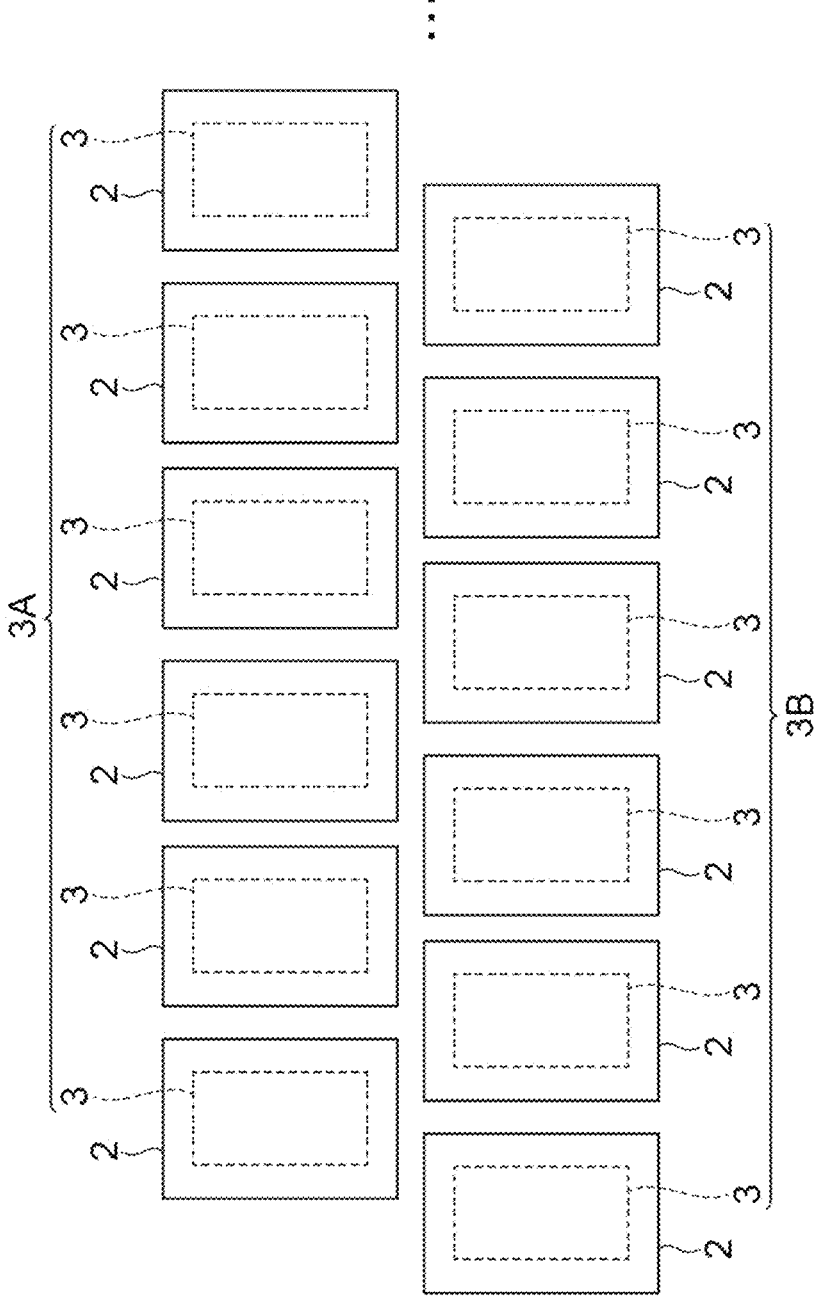

FIG. 16 is a diagram schematically showing a configuration according to a seventh modification example.

Figure 17:
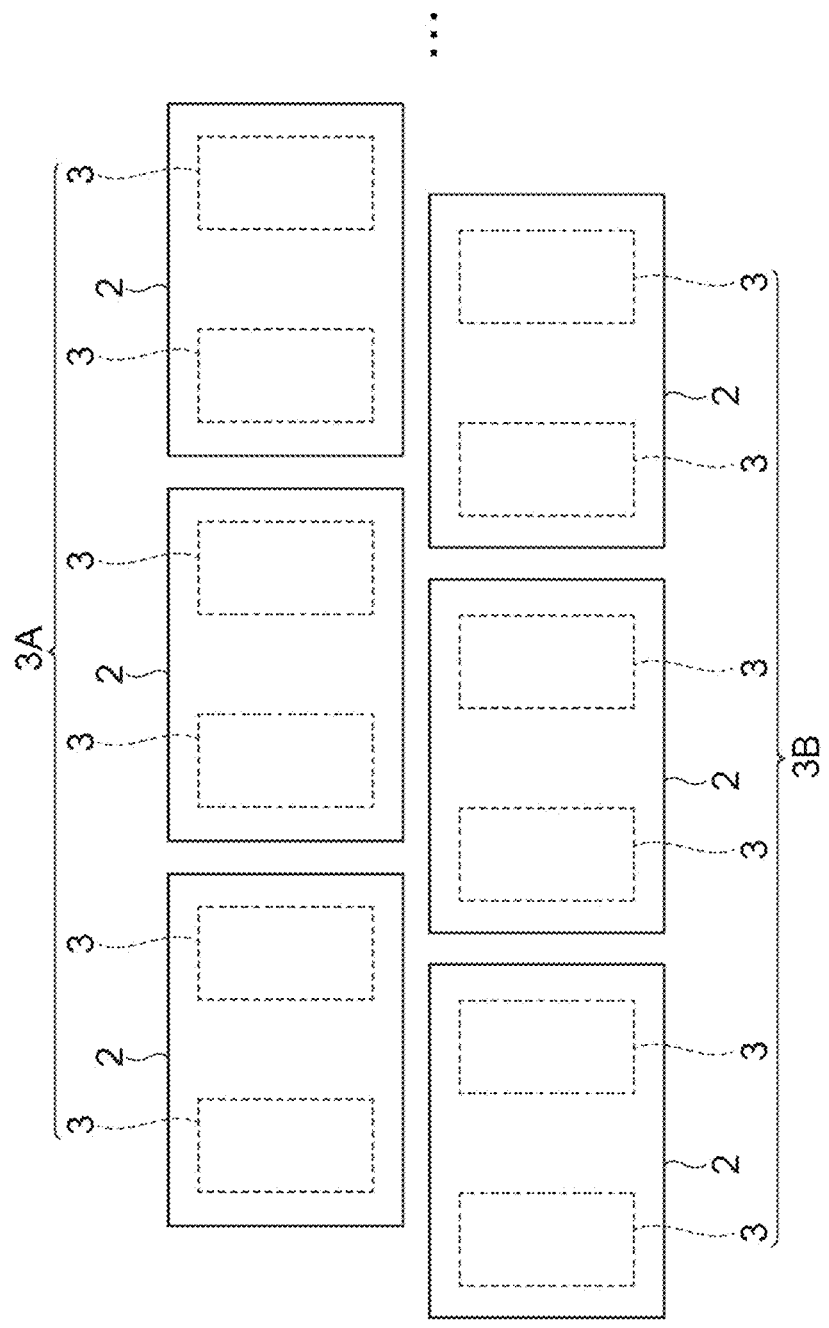

FIG. 17 is a diagram schematically showing a configuration according to the seventh modification example.

Figure 18:
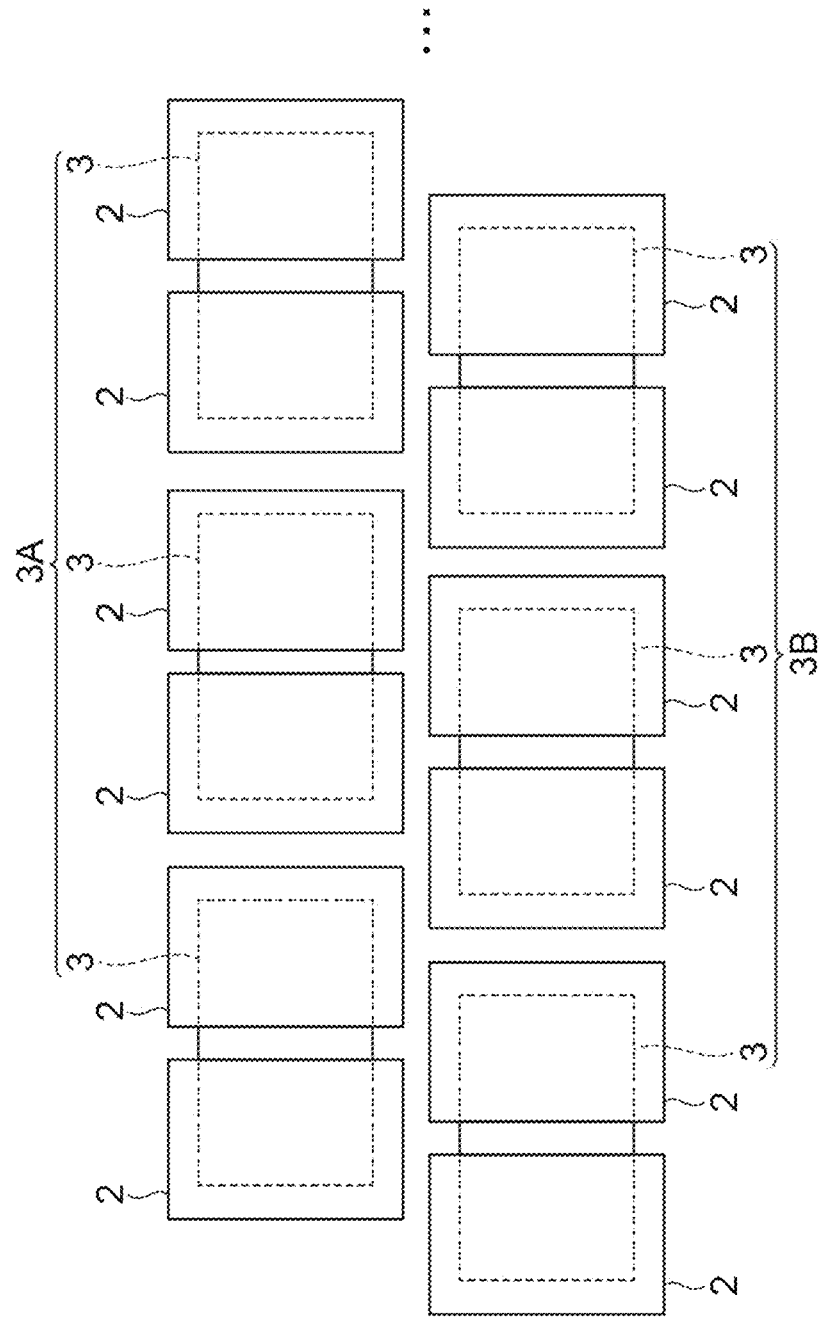

FIG. 18 is a diagram schematically showing a configuration according to the seventh modification example.

Figure 19:
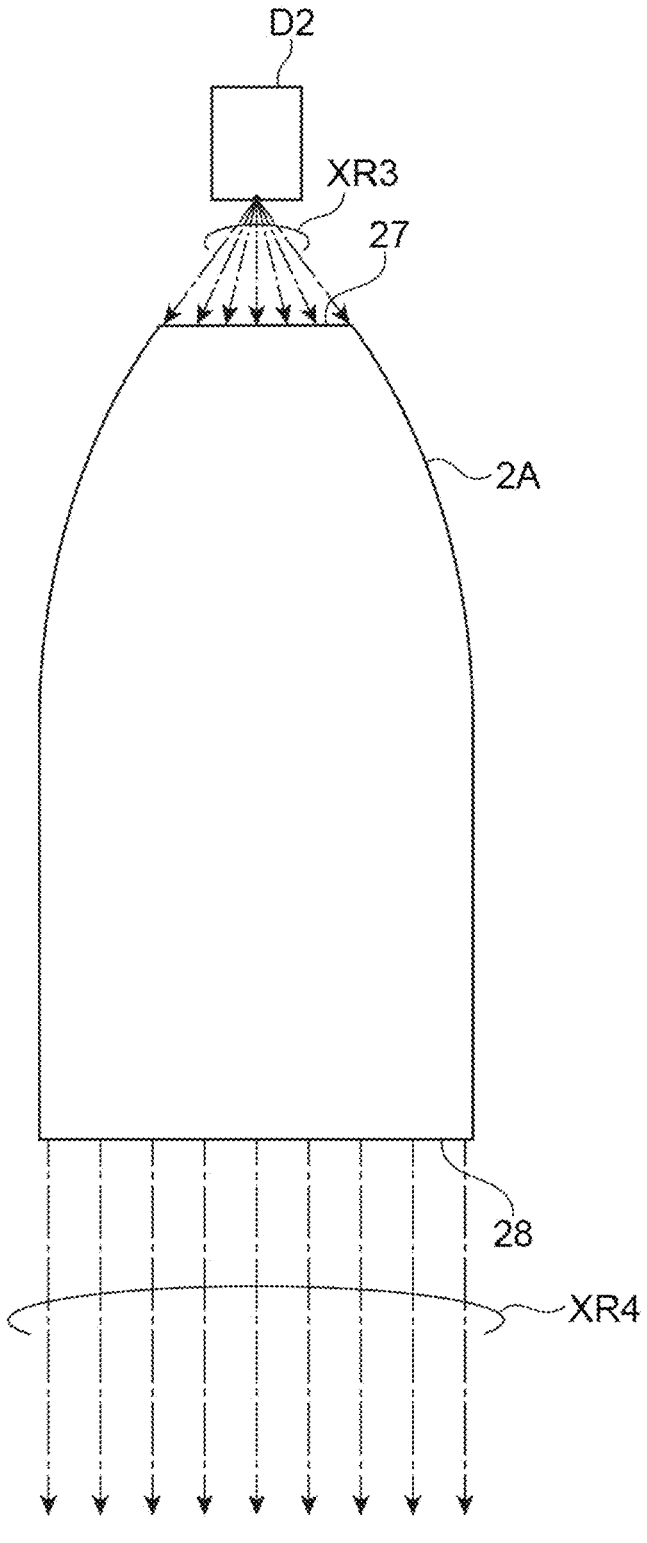

FIG. 19 is a side view of a capillary lens according to an eighth modification example.

Figure 20:
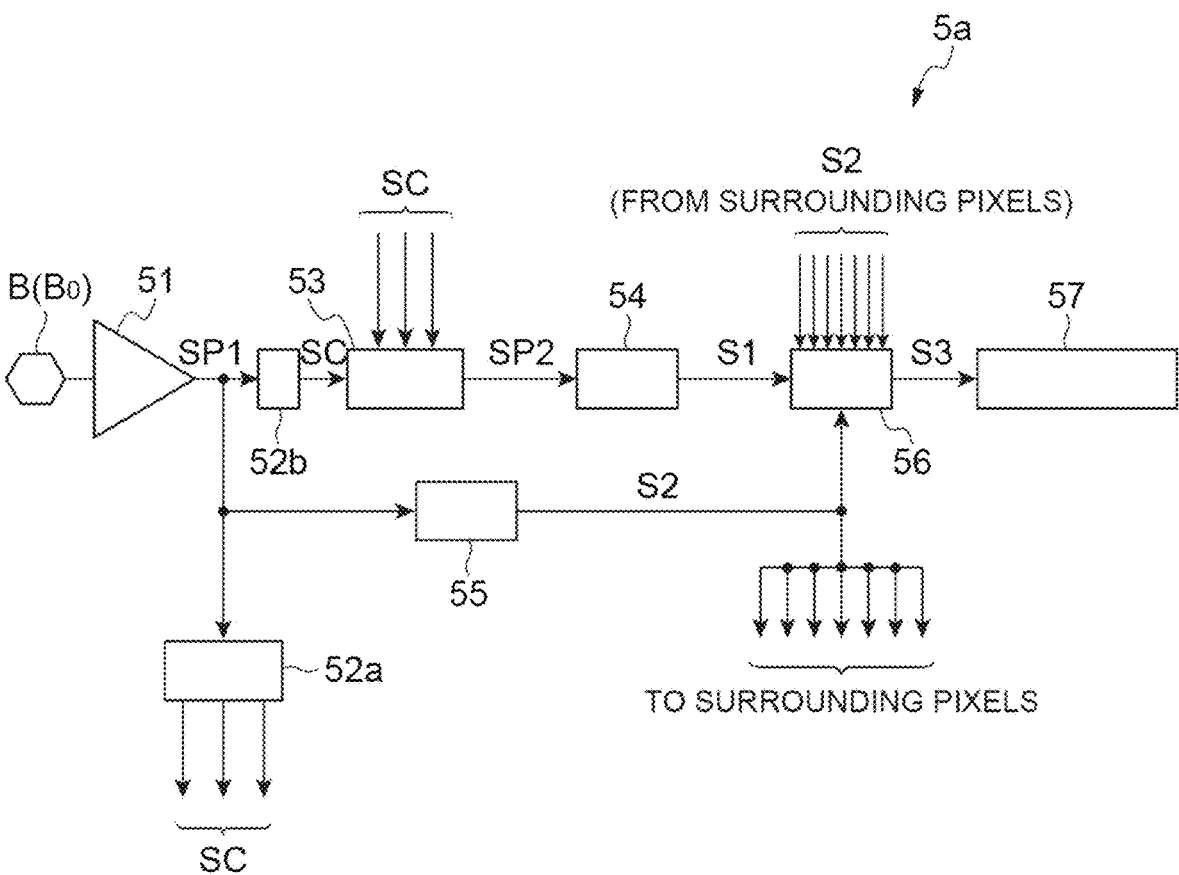

FIG. 20 is a diagram showing an example of the internal configuration of a pixel circuit in a ninth modification example.

Figure 21:
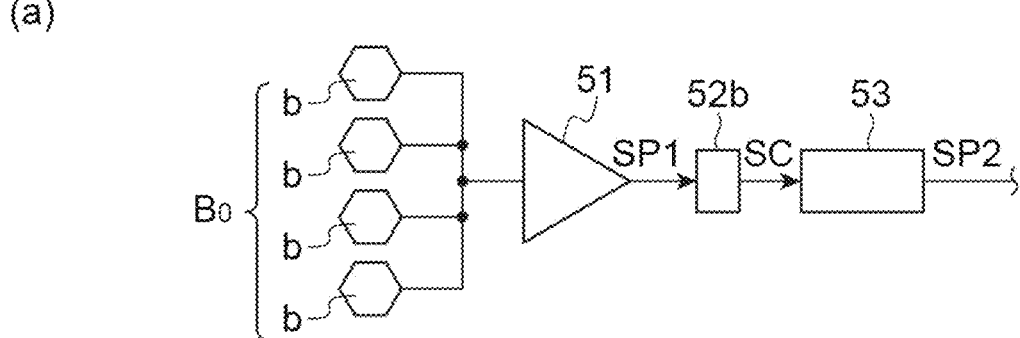
Figure 21:
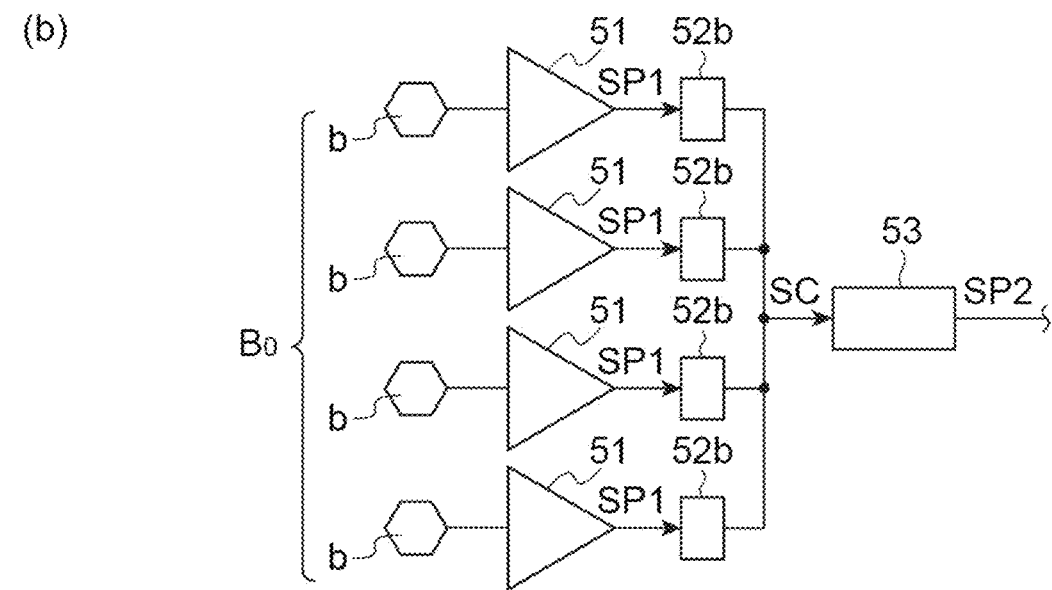

(a) of FIG. 21 is a diagram showing a case where a plurality of electrodes are connected to an input terminal of one signal generator. (b) of FIG. 21 is a diagram showing a case where a plurality of electrodes are connected to a plurality of signal generators, respectively.

Figure 22:
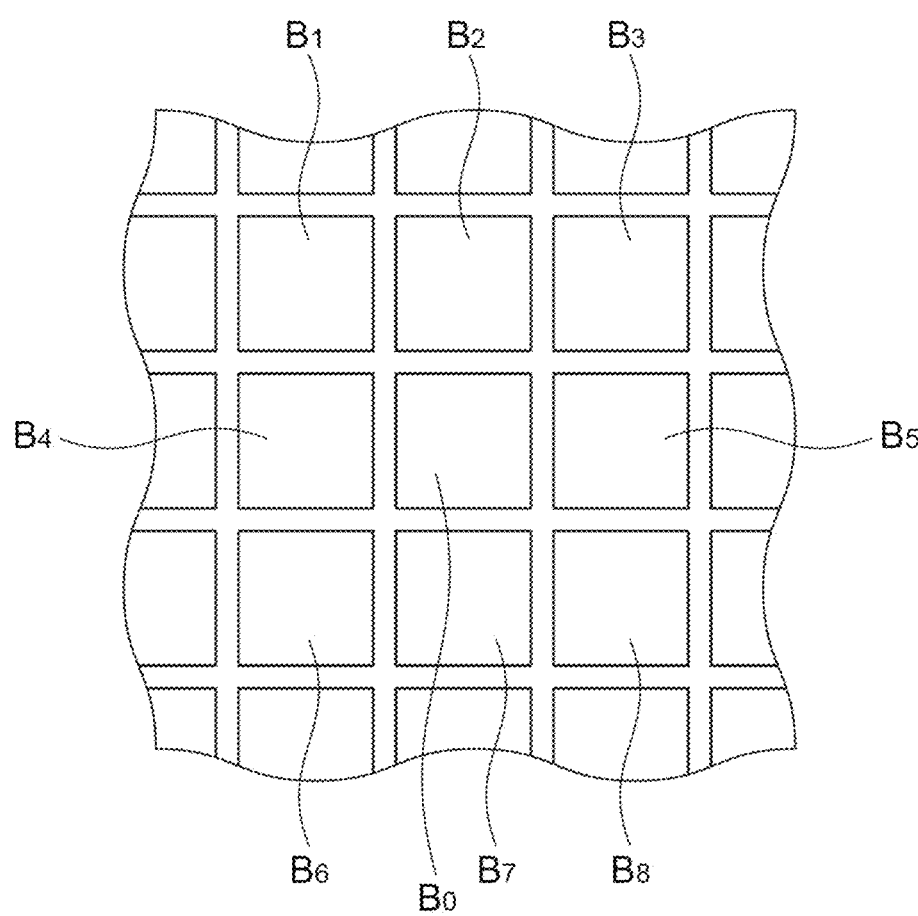

FIG. 22 is a diagram showing a self-electrode portion and eight surrounding electrode portions surrounding the self-electrode portion.

Figure 23:
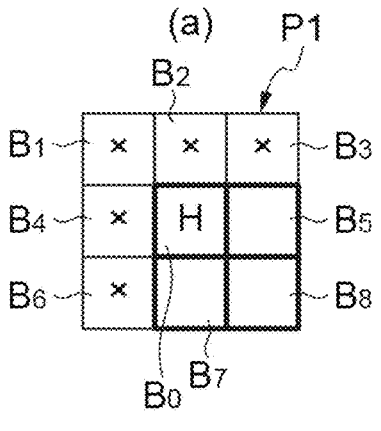
Figure 23:
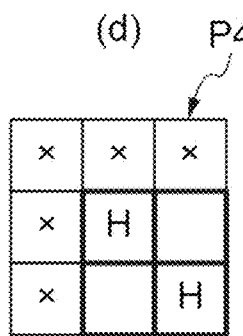
Figure 23:
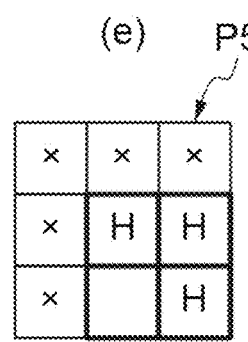
Figure 23:
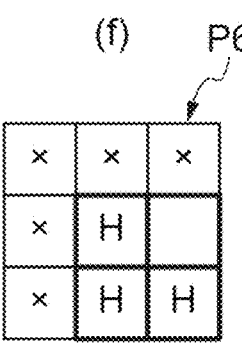
Figure 23:
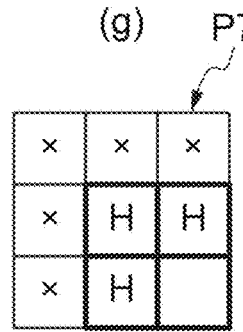
Figure 23:
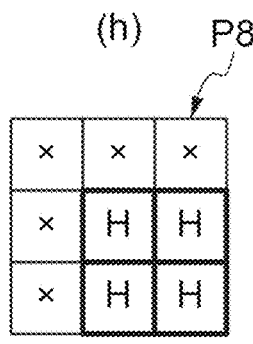
Figure 23:
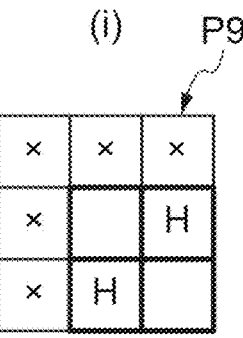
Figure 23:
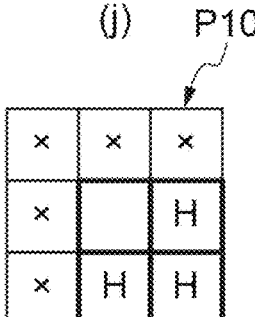

(a) to (j) of FIG. 23 are diagrams showing ten determination patterns as examples of a plurality of determination patterns set in a carrier input pattern determination portion.

DESCRIPTION OF EMBODIMENTS

An X-ray detection device according to one aspect of the present disclosure includes at least one capillary, at least one X-ray detection element, and at least one detection circuit. The capillary has a first surface, a second surface facing away from the first surface, a plurality of X-ray passing regions, and an X-ray shielding region. The plurality of X-ray passing regions penetrate from the first surface to the second surface. The X-ray shielding region is arranged between the plurality of X-ray passing regions. The X-ray detection element has a conversion portion and a plurality of pixel electrode portions. The conversion portion has a third surface facing the second surface of the capillary and a fourth surface facing away from the third surface. The conversion portion absorbs an X-ray to generate carriers. The plurality of pixel electrode portions are arranged in a two-dimensional manner on the fourth surface of the conversion portion. The detection circuit detects carriers collected from the conversion portion through the plurality of pixel electrode portions. An inner diameter of each of the X-ray passing regions when viewed from an X-ray incidence direction is smaller than a width of each of the pixel electrode portions in an arrangement direction when viewed from the same direction. When a plurality of carriers generated by incidence of an X-ray are dispersed and collected in two or more of the pixel electrode portions, the detection circuit determines one pixel electrode portion corresponding to an X-ray incidence position among the plurality of pixel electrode portions and corrects and evaluates an amount of carriers in the one pixel electrode portion or ignores the incidence of the X-ray.

In the X-ray detection device, when charge share occurs, that is, when a plurality of carriers generated by incidence of X-rays are dispersed and collected in a plurality of pixel electrode portions, the detection circuit determines a pixel electrode portion corresponding to the X-ray incidence position and corrects and evaluates the amount of carriers in the pixel electrode portion or ignores the incidence of the X-ray. Therefore, it is possible to reduce the influence of carrier dispersion on the image. As a result, it is possible to improve the energy resolution and suppress blurring of an image due to charge share.

In the X-ray detection device according to one aspect of the present disclosure, the plurality of X-ray passing regions of the capillary may be arranged on a triangular lattice on the first surface and the second surface. The plurality of pixel electrode portions of the X-ray detection element may be arranged side by side in a row direction and a column direction on the fourth surface. When the arrangement form of the plurality of X-ray passing regions is different from the arrangement form of the plurality of pixel electrode portions as described above, the frequency of arrangement of the X-ray passing regions on the gap between the pixel electrode portions is further increased. In such a case, the X-ray detection device described above is particularly useful.

In the X-ray detection device according to one aspect of the present disclosure, the second surface and the third surface may be spaced apart from each other with a gap interposed therebetween. As the distance of the capillary from the X-ray detection element increases, the extent to which the X-ray spread after passing through each X-ray passing region increases. For this reason, the frequency of charge share increases. In such a case, the X-ray detection device described above is particularly useful. In addition, since the capillary is spaced apart from the X-ray detection element, the degree of freedom of arrangement of the capillary and the X-ray detection element can be increased.

In the X-ray detection device according to one aspect of the present disclosure, the second surface and the third surface may be bonded to each other with an adhesive. In this case, since the X-ray reach the conversion portion of the X-ray detection element before the X-ray passing through each X-ray passing region spread, it is possible to reduce the charge share compared with a case where the second surface and the third surface are spaced apart from each other with a gap interposed therebetween.

In the X-ray detection device according to one aspect of the present disclosure, central axes of the plurality of X-ray passing regions may be parallel to each other. In this case, the X-ray passing through the capillary can be collimated to improve the visibility of the X-ray image.

The X-ray detection device according to one aspect of the present disclosure may further include a container that airtightly houses the capillary, the X-ray detection element, and the detection circuit. The container may have a window member that transmits an X-ray directed toward the capillary. In this case, it is possible to prevent dust from adhering to the capillary, the X-ray detection element, and the detection circuit. In particular, when the X-ray passing region of the capillary is a fine hole, it is difficult to remove dust entering the hole, leading to degradation of image quality. By providing the X-ray detection device with the container described above, it is possible to prevent dust from entering the hole. As a result, it is possible to maintain image quality.

The X-ray detection device according to one aspect of the present disclosure may further include a support portion fixed to a side of the capillary to support the capillary. In this case, compared with a case where the second surface of the capillary is supported, the capillary can be brought closer to the X-ray detection element by the thickness of the member that supports the capillary. Therefore, since the extent to which the X-ray spread after passing through each X-ray passing region is reduced, it is possible to reduce the charge share.

The X-ray detection device according to one aspect of the present disclosure may further include a base member on which the X-ray detection element is mounted and a support that stands on the base member and supports the capillary. In this case, the second surface of the capillary and the third surface of the X-ray detection element can be easily brought close to each other in parallel. In other words, the center axis of the X-ray passing region can be easily brought close to the third surface of the X-ray detection element so as to be perpendicular thereto.

In the X-ray detection device according to one aspect of the present disclosure, the detection circuit may be built in a semiconductor integrated element. The fourth surface of the X-ray detection element may face the semiconductor integrated element. Each of the pixel electrode portions may be connected to the semiconductor integrated element through a metal bump. Generally, a bump used for electrically connection mainly contains a metal with a relatively high atomic number, such as lead (Pb) or gold (Au), and has an effect of shielding X-ray. Therefore, by connecting each pixel electrode portion to the semiconductor integrated element through a metal bump, at least a part of the detection circuit in the semiconductor integrated element can be protected from X-ray.

In the X-ray detection device according to one aspect of the present disclosure, a plurality of X-ray detection elements may face one of the capillary. In this case, since a plurality of X-ray detection elements are arranged side by side, it is possible to increase the area of the light receiving region by using the small X-ray detection element.

In the X-ray detection device according to one aspect of the present disclosure, a plurality of capillaries may face one of the X-ray detection element. In this case, since a plurality of capillaries are arranged side by side, even if the manufacturing yield of the large-area capillary is low, it is possible to manufacture the X-ray detection device with a high yield by using a plurality of small-area capillaries.

The X-ray detection device according to one aspect of the present disclosure may include: a first element row including two or more of the X-ray detection elements arranged in a predetermined direction; and a second element row including two or more of the X-ray detection elements arranged along the first element row. Each of the X-ray detection elements of the first element row and each of the X-ray detection elements of the second element row may be alternately arranged. In this case, when the X-ray detection device is used as a line sensor, it is possible to reduce or eliminate a dead area between the X-ray detection elements.

Hereinafter, embodiments of an X-ray detection device according to the present disclosure will be described in detail with reference to the accompanying diagrams. In addition, the present invention is not limited to the examples, and is indicated by the appended claims and is intended to include all modifications within the meaning and scope equivalent to the appended claims. In the following description, the same elements will be denoted by the same reference numerals in the description of the diagrams, and repeated description thereof will be omitted.

Figure 1:
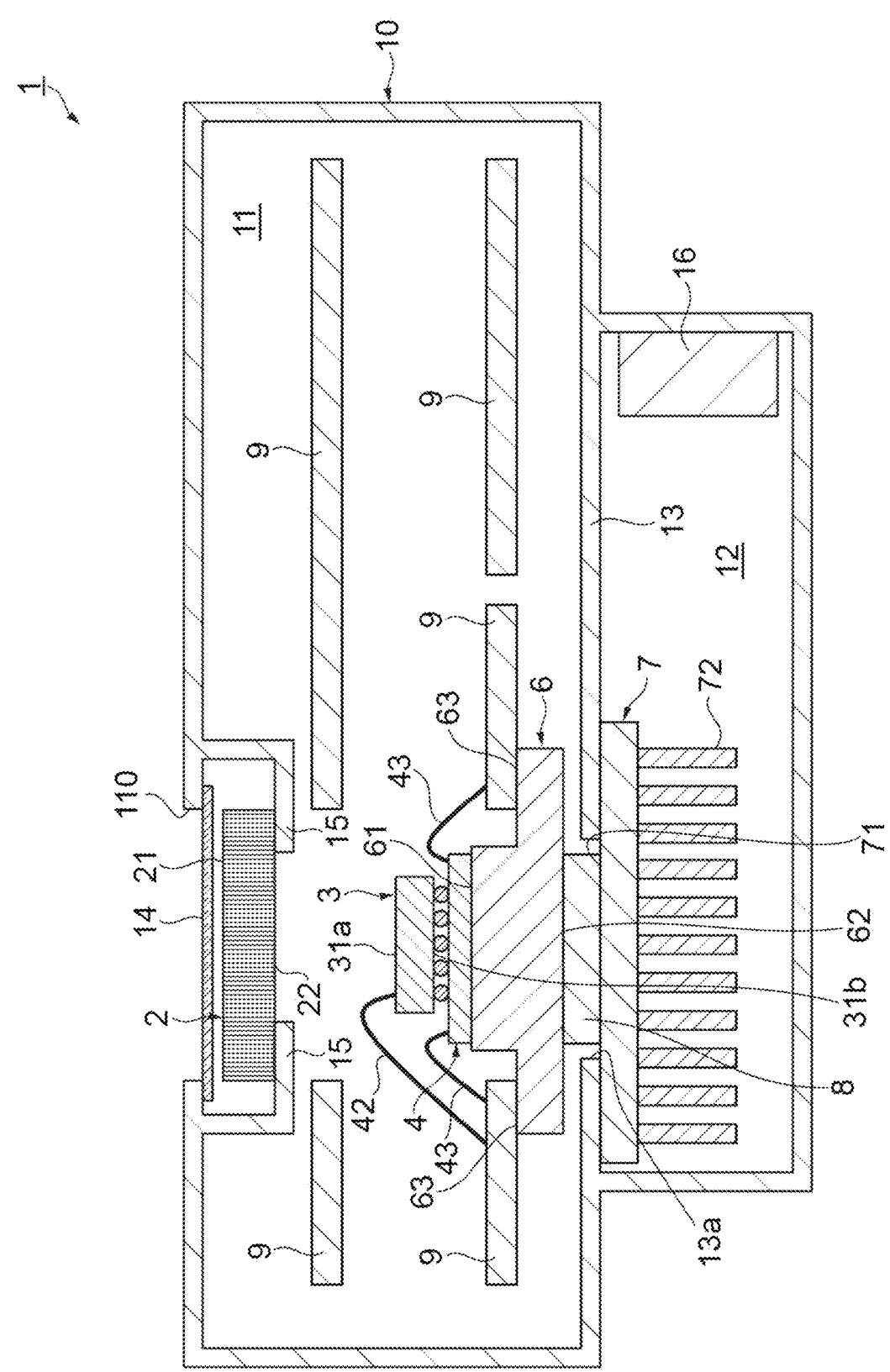
FIG. 1 is a cross-sectional view showing the configuration of an X-ray detection device according to an embodiment.

FIG. 1 is a cross-sectional view showing the configuration of an X-ray detection device 1 according to the present embodiment. As shown in FIG. 1, the X-ray detection device 1 according to the present embodiment includes a capillary plate 2, an X-ray detection element 3, a semiconductor integrated element 4, a base member 6, a heat sink 7, a Peltier element 8, a plurality of circuit boards 9, and a container 10.

The capillary plate 2 is an example of a capillary in the present embodiment. The capillary plate 2 collimates an X-ray incident on the X-ray detection device 1 toward the X-ray detection element 3. The capillary plate 2 has a plate shape having a front surface 21 as a first surface and a back surface 22 as a second surface facing away from the front surface 21. In one example, the front surface 21 and the back surface 22 are parallel to each other.

Figure 2:
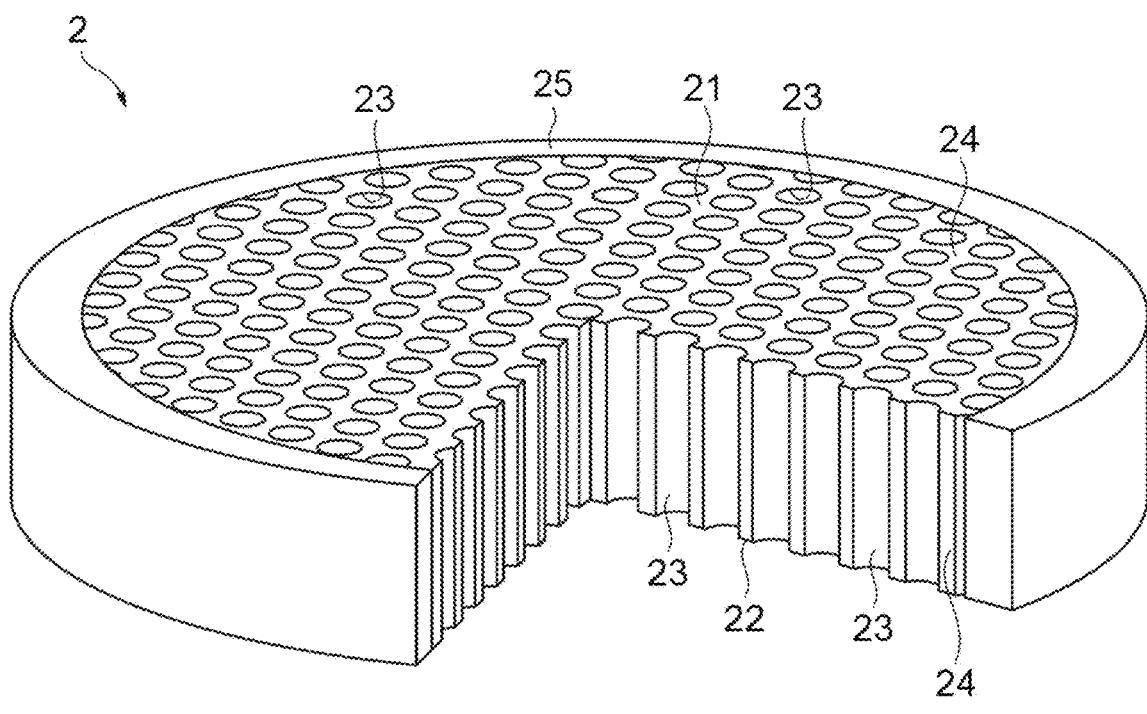
FIG. 2 is a cutaway perspective view showing the appearance of a capillary plate.

FIG. 2 is a cutaway perspective view showing the appearance of the capillary plate 2. As shown in FIG. 2, the capillary plate 2 has a circular shape when viewed from the normal direction of the front surface 21 and the back surface 22, that is, from the X-ray incidence direction. The shape of the capillary plate 2 is not limited to this, and may be other shapes such as a square or a rectangle. The capillary plate 2 has a plurality of X-ray passing regions 23. Each of the X-ray passing regions 23 penetrates the capillary plate 2 from the front surface 21 to the back surface 22. In one example, the X-ray passing region 23 is a hole penetrating from the front surface 21 to the back surface 22. The X-ray passing region 23 is not limited to this, and may be formed of an X-ray transmissive material filled in the hole. The shape of the X-ray passing region 23 viewed from the normal direction of the front surface 21 and the back surface 22 is, for example, circular. A plurality of X-ray passing regions 23 are arranged on a triangular lattice on the front surface 21 and the back surface 22. More specifically, the central axis of each X-ray passing region 23 overlaps each lattice point of the triangular lattice. The central axes of the plurality of X-ray passing regions 23 are parallel to each other and along the normal direction of the front surface 21 and the back surface 22. The capillary plate 2 further has an X-ray shielding region 24. The X-ray shielding region 24 is arranged between the plurality of X-ray passing regions 23. In other words, all portions of the capillary plate 2 excluding the X-ray passing region 23 are the X-ray shielding region 24.

The capillary plate 2 having such a configuration can be manufactured, for example, as follows. First, a large number of structures are manufactured in which a cylindrical second member for shielding X-ray is arranged around a columnar first member. Then, the structures are bundled and stretched in the axial direction. The structures are cut into plates along a plane perpendicular to the axis. Finally, the first member is etched away. At the peripheral edge of the capillary plate 2, the X-ray passing region 23 is not formed, and a non-passing region 25 that shields X-ray is present. The non-passing region 25 may be formed of the same material as the X-ray shielding region 24 or may be formed of a material different from that of the X-ray shielding region 24. The non-passing region 25 has a circular frame shape. The non-passing region 25 is provided to hold the structures when stretching the structures when manufacturing the capillary plate 2.

An X-ray is incident on the capillary plate 2 from the front surface 21 side. The X-ray is emitted from the back surface 22 side through the X-ray passing region 23. The X-ray traveling in a direction inclined with respect to the central axis direction of the X-ray passing region 23 are blocked by the X-ray shielding region 24 and are not emitted from the back surface 22 side. As a result, the capillary plate 2 collimates the X-ray so that the traveling directions of the incident X-ray are aligned with the normal direction of the back surface 22, and emits the collimated X-ray.

Figure 3:
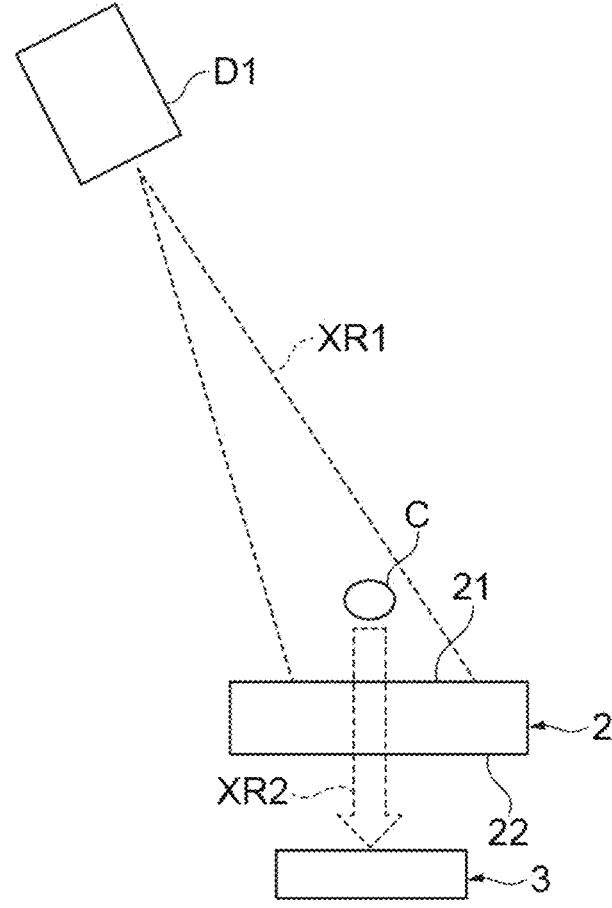
FIG. 3 is a diagram for explaining an example of the effect of the capillary plate.

FIG. 3 is a diagram for explaining an example of the effects of the capillary plate 2. When an object C is irradiated with an excitation X-ray XR1 from an X-ray source D1, the object C is excited to generate a fluorescent X-ray XR2 that is a detection target. A parallel component contained in the fluorescent X-ray XR2 passes through the X-ray passing region 23 of the capillary plate 2 and reaches the X-ray detection element 3. Since the optical axis of the X-ray source D1 is inclined with respect to the central axis direction of the X-ray passing region 23, that is, the normal direction of the front surface 21, the excitation X-ray XR1 hardly passes through the X-ray passing region 23. As a result, the excitation X-ray XR1 reaching the X-ray detection element 3 can be reduced, and the fluorescent X-ray XR2 can be detected with high accuracy.

In one embodiment, the diameter of the capillary plate 2 is in the range of 1 mm to 1000 mm, and is 25 mm in one embodiment. When the planar shape of the capillary plate 2 is quadrangular, the diameter of the capillary plate 2 is replaced with the length of the long side. The inner diameter of the X-ray passing region 23 is in the range of several micrometers to several hundred micrometers, and is 25 μm in one embodiment. The center-to-center spacing, that is, the pitch, between the X-ray passing regions 23 is in the range of several micrometers to several hundred micrometers. The thickness of the capillary plate 2 is in the range of several hundred micrometers to several tens of millimeters, and is 5.0 mm in one embodiment. The thickness of the capillary plate 2 is the distance between the front surface 21 and the back surface 22, in other words, the length of the X-ray passing region 23. The material of the X-ray shielding region 24 is, for example, lead glass.

Figure 4:
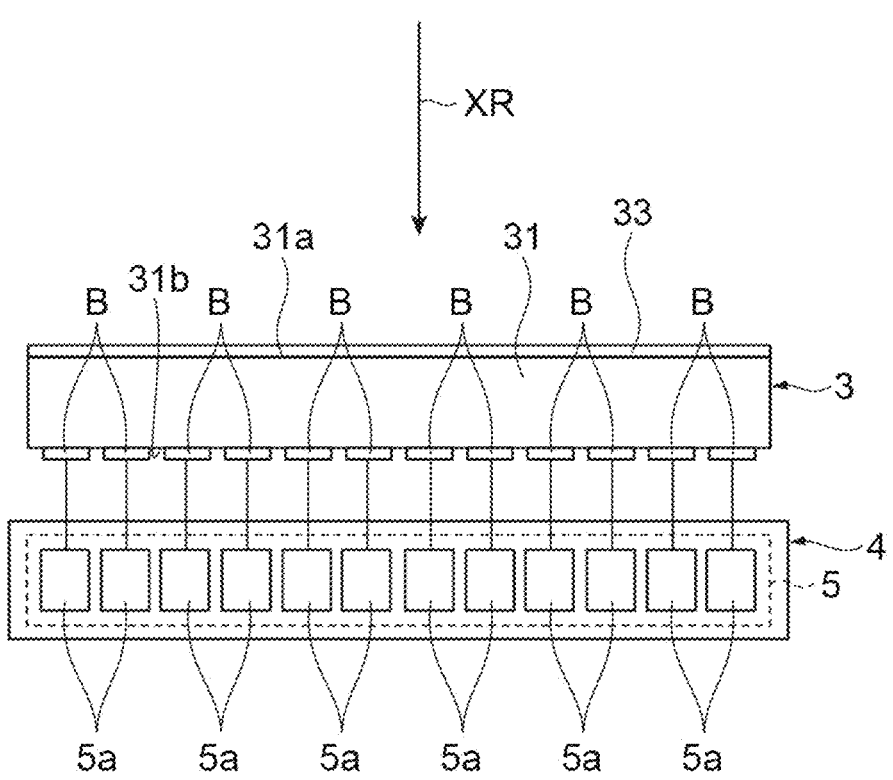
FIG. 4 is a schematic diagram showing the configuration of an X-ray detection element and a semiconductor integrated element.

FIG. 1 is referred to again. The X-ray detection element 3 is arranged so as to face the back surface 22 of the capillary plate 2. The X-ray detection element 3 detects X-ray that have passed through the capillary plate 2, for example, the fluorescent X-ray XR2 shown in FIG. 3. The X-ray detection element 3 is mounted on the semiconductor integrated element 4. In one example, the X-ray detection element 3 is flip-chip mounted on the semiconductor integrated element 4. FIG. 4 is a schematic diagram showing the configuration of the X-ray detection element 3 and the semiconductor integrated element 4. As shown in FIG. 4, the X-ray detection element 3 according to the present embodiment has a conversion portion 31 and a plurality of pixel electrode portions B.

The conversion portion 31 is a bulk or layered member, and absorbs X-ray XR to generate carriers. The conversion portion 31 is formed of a material containing at least one of CdTe, CdZnTe, GaAs, InP, TlBr, HgI$_2$, PbI$_2$, Si, Ge, and a-Se, for example. The conversion portion 31 extends along a plane crossing the incidence direction of the X-ray XR. The conversion portion 31 has a front surface 31a and a back surface 31b facing away from each other. In one example, the front surface 31a is parallel to the back surface 31b. The planar shape of the conversion portion 31 is, for example, a rectangle or a square. The length of the long side of the conversion portion 31 when the planar shape of the conversion portion 31 is a rectangle or the length of one side of the conversion portion 31 when the planar shape of the conversion portion 31 is a square is in the range of 1 mm to 500 mm, for example. On the front surface 31a, a bias electrode 33 as a common electrode is provided so as to cover the entire front surface 31a. The front surface 31a faces the back surface 22 of the capillary plate 2. The X-ray XR that have passed through the capillary plate 2 and the bias electrode 33 are incident on the front surface 31a. The back surface 22 of the capillary plate 2 and the front surface 31a of the X-ray detection element 3 are arranged in a state close to parallel to each other.

Figure 5:
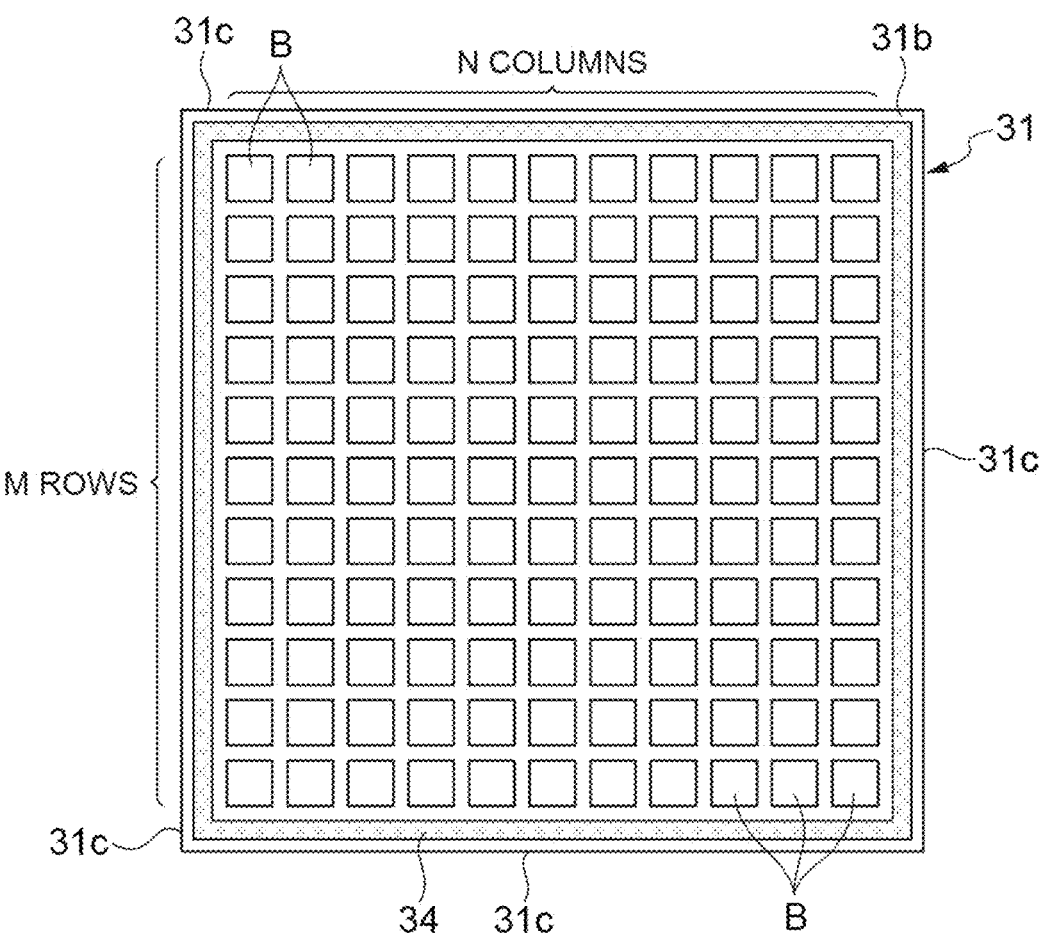
FIG. 5 is a plan view showing the arrangement of a plurality of pixel electrode portions on the back surface of a conversion portion.
Figure 6:
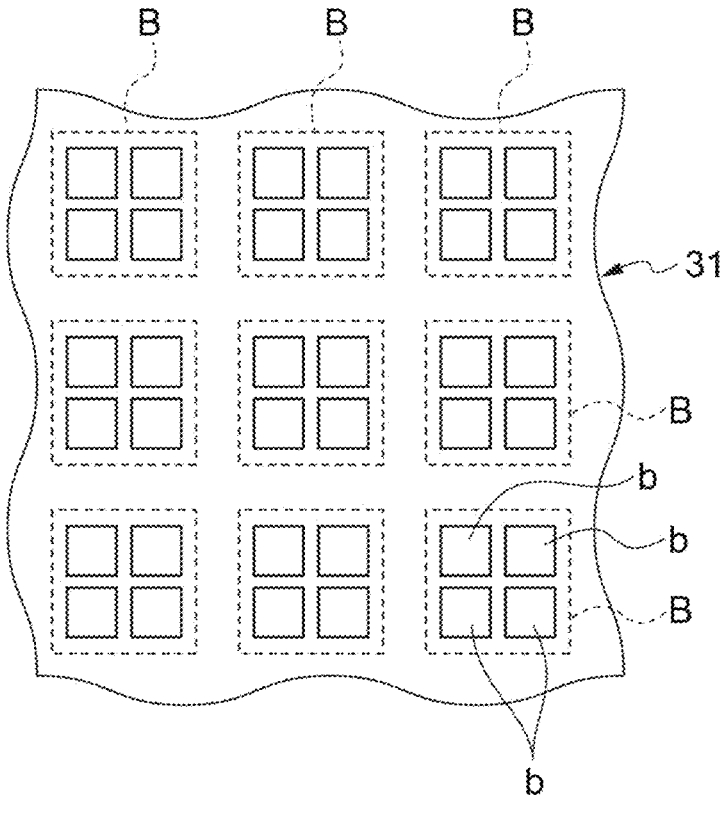
FIG. 6 is a diagram showing a case where one pixel electrode portion includes a plurality of electrodes.

The plurality of pixel electrode portions B are conductive films provided on the back surface 31b of the conversion portion 31. The pixel electrode portion B is, for example, a metal film. A high bias voltage is applied between the bias electrode 33 and the plurality of pixel electrode portions B in order to deplete the conversion portion 31. FIG. 5 is a plan view showing the arrangement of a plurality of pixel electrode portions B on the back surface 31b of the conversion portion 31. The plurality of pixel electrode portions B are arranged in a two-dimensional manner of M rows×N columns when viewed from the X-ray incidence direction. M and N are integers of 2 or more. The two-dimensional shape is, for example, a matrix shape. The planar shape of the pixel electrode portion B is, for example, a rectangle or a square, and has sides along the row direction and the column direction. The widths of each pixel electrode portion B in the row direction and the column direction are in the range of 10 μm to 10000 μm, for example. Therefore, the inner diameter of each X-ray passing region 23 of the capillary plate 2 viewed from the X-ray incidence direction is smaller than the width of each pixel electrode portion B in the arrangement direction, that is, in the row direction and the column direction, when viewed from the same direction. Each of the M×N pixel electrode portions B forms each pixel region of M rows by N columns in the conversion portion 31. Each pixel electrode portion B collects carriers generated in the corresponding pixel region. In the example of FIG. 5, each pixel electrode portion B includes a single electrode. As shown in FIG. 6, for example, each pixel electrode portion B may include a plurality of electrodes b. In the shown example, in each pixel electrode portion B, four square electrodes b are arranged in two rows by two columns. The material of the pixel electrode portion B is, for example, Al, AlCu, Au, other materials, or a combination of two or more of these.

Figure 7:
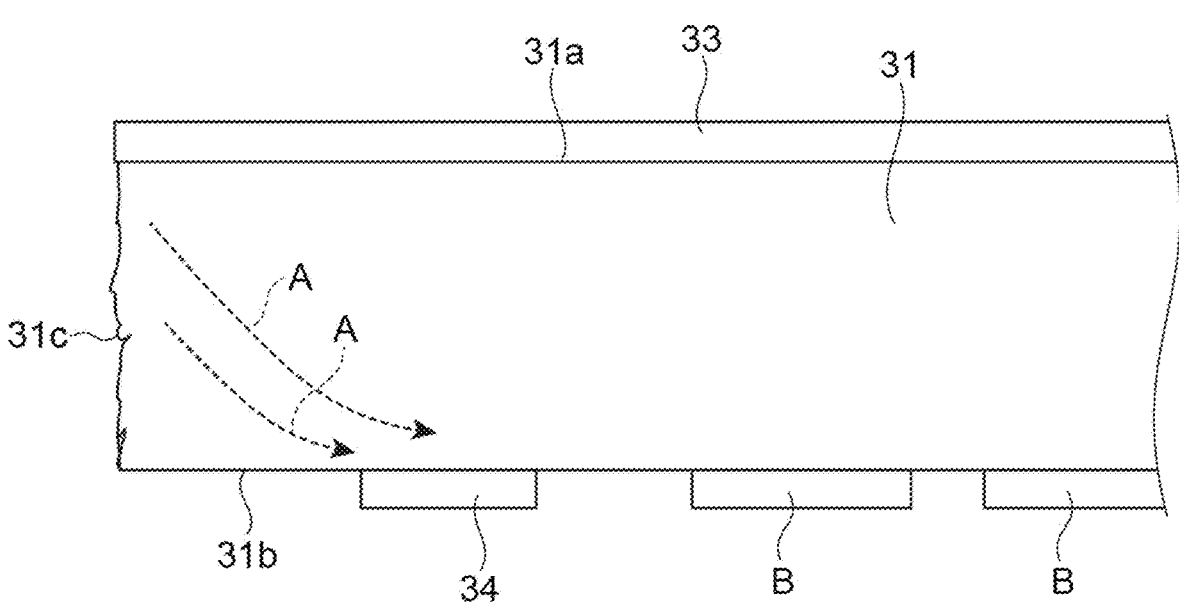
FIG. 7 is a diagram for explaining the function and effect of a guard ring.

As shown in FIG. 5, on the back surface 31b of the conversion portion 31, a guard ring 34 is provided between an electrode group including a plurality of pixel electrode portions B and the edge, that is, a side 31c of the conversion portion 31. The guard ring 34 is a conductive film provided on the back surface 31b. The guard ring 34 is, for example, a metal film. The electric potential of the guard ring 34 is set to be the same as the electric potential of the pixel electrode portion B or close to the electric potential of the pixel electrode portion B. FIG. 7 is a diagram for explaining the function and effect of the guard ring 34. When manufacturing the X-ray detection element 3, the conversion portion 31 is separated into individual pieces by dicing. Therefore, the side 31c of the conversion portion 31 becomes a rough surface. When a dark current A reaches the pixel electrode portion B from the side 31c, the dark current A becomes noise, leading to image degradation. The guard ring 34 is arranged between the side 31c and the pixel electrode portion B to absorb the dark current A, so that the dark current A reaching the pixel electrode portion B is reduced. As shown in FIG. 5, the guard ring 34 is provided along the side 31c of the conversion portion 31. When the planar shape of the conversion portion 31 is a square or a rectangle, the planar shape of the guard ring 34 is a square or rectangular frame shape.

As shown in FIG. 4, the semiconductor integrated element 4 includes a detection circuit 5. The detection circuit 5 detects carriers generated in the conversion portion 31 through each pixel electrode portion B for each pixel region. The detection circuit 5 counts the number of X-ray photons for each pixel region based on the detected carriers. The detection circuit 5 is realized by an integrated circuit, such as an ASIC (Application Specific Integrated Circuit), for example. The detection circuit 5 has a plurality of pixel circuits (M×N pixel circuits) 5a. Each pixel circuit 5a detects carriers collected in the corresponding pixel electrode portion B. Each pixel circuit 5a counts the number of X-ray photons based on the detected carriers. Alternatively, each pixel circuit 5a may generate a signal indicating the magnitude of incident X-ray by integrating the carriers collected in the corresponding pixel electrode portion B.

A plurality of carriers generated by the incidence of an X-ray may be dispersed and collected in two or more pixel electrode portions B. In such a case, the detection circuit 5 determines the pixel electrode portion B corresponding to the X-ray incidence position. The detection circuit 5 corrects and evaluates the amount of carriers in the pixel electrode portion B.

Specifically, when the carriers generated by the incidence of an X-ray are dispersed and collected in two or more pixel electrode portions B, the detection circuit 5 determines the pixel electrode portion B in which the largest number of carriers are collected to be the pixel electrode portion B corresponding to the X-ray incidence position. Then, the detection circuit 5 evaluates the sum of the carriers collected in the pixel electrode portion B and the eight pixel electrode portions B surrounding the pixel electrode portion B as the sum of the carriers collected in the pixel electrode portion B corresponding to the X-ray incidence position. The details of this method are described in Non Patent Literatures 1 and 2.

Alternatively, when the carriers generated by the incidence of an X-ray are dispersed and collected in two or more pixel electrode portions B, the detection circuit 5 may ignore the incidence of the X-ray. Specifically, a certain threshold value is set in advance. If two or more pixel electrode portions B in which carriers of an amount exceeding the threshold value are collected are present at the same time, the detection circuit 5 ignores the incidence of the X-ray. FIG. 8 is a diagram for explaining an example of the method. Here, the explanation will be given with the threshold value as 2 keV. Part (a) of FIG. 8 shows a case where carriers of an amount corresponding to 10 keV are detected in a certain pixel electrode portion Ba among the plurality of pixel electrode portions B and no carriers are detected in the pixel electrode portions B around the pixel electrode portion Ba. In this case, there is only one pixel electrode portion B in which the carriers of an amount exceeding the threshold value are collected. Therefore, the pixel electrode portion Ba is determined to be the pixel electrode portion B corresponding to the X-ray incidence position. Then, the amount of carriers in the pixel electrode portion Ba is evaluated as the amount of carriers collected in the pixel electrode portion B corresponding to the X-ray incidence position. Part (b) of FIG. 8 shows a case where carriers of an amount equivalent to 9 keV are detected in a certain pixel electrode portion Ba and carriers of an amount equivalent to 1 keV are detected in a certain pixel electrode portion Bb of the pixel electrode portions B around the pixel electrode portion Ba. Also in this case, there is only one pixel electrode portion B in which the carriers of an amount exceeding the threshold value are collected. Therefore, it is not determined that the carriers generated by the incidence of X-ray are dispersed and collected in two or more pixel electrode portions B, and the pixel electrode portion Ba is determined to be the pixel electrode portion B corresponding to the X-ray incidence position. Then, the amount of carriers in the pixel electrode portion Ba is evaluated as the amount of carriers collected in the pixel electrode portion B corresponding to the X-ray incidence position. Part (c) of FIG. 8 shows a case where carriers of an amount corresponding to 7 keV are detected in a certain pixel electrode portion Ba and carriers of an amount corresponding to 3 keV are detected in a certain pixel electrode portion Bb around the pixel electrode portion Ba. In this case, there are two pixel electrode portions B in which the carriers of an amount exceeding the threshold value are collected. Therefore, the detection circuit 5 determines that the carriers generated by the incidence of X-ray are dispersed and collected in two or more pixel electrode portions B, and does not determine any pixel electrode portion B as the pixel electrode portion B corresponding to the X-ray incidence position. As a result, the incidence of the X-ray are ignored. The details of this method are described in Non Patent Literature 3.

The function of the detection circuit 5 described above can be appropriately realized by, for example, an electronic circuit including a logic circuit, a computer, or a combination thereof. A computer includes a CPU and memory, and the CPU executes a program stored in the memory.

FIG. 9 is a perspective view showing the X-ray detection element 3 and the semiconductor integrated element 4. FIG. 10 is a cross-sectional view schematically showing the arrangement of the capillary plate 2, the X-ray detection element 3, and the semiconductor integrated element 4. As shown in these diagrams, the X-ray detection element 3 is mounted on the semiconductor integrated element 4. The back surface 31b of the X-ray detection element 3 faces the semiconductor integrated element 4. Each pixel electrode portion B is connected to the semiconductor integrated element 4 through a metal bump 41. The bump 41 mainly contains a metal with a relatively high atomic number, such as lead (Pb) or gold (Au). The material of the bump 41 is, for example, lead solder, Au, or In. The diameter of the bump 41 is in the range of 10 μm to 10000 μm, for example. The bump 41 has an effect of shielding X-ray. The bump 41 protects at least a part of each pixel circuit 5a in the semiconductor integrated element 4 from X-ray passing through the conversion portion 31. The atomic number of the metal forming the bump 41 may be higher than the atomic number of the material forming the conversion portion 31. A circuit portion of the pixel circuit 5a that is particularly susceptible to X-ray may be arranged immediately below the bump 41 in the X-ray incidence direction.

The bias electrode 33 provided on the front surface 31a of the conversion portion 31 of the X-ray detection element 3 is electrically connected to one of the circuit boards 9 (see FIG. 1) through a bonding wire 42. A bias voltage is applied to the bias electrode 33 through the bonding wire 42. M×N electrodes connected to the bumps 41 and a plurality of electrodes for signal output are provided on the front surface of the semiconductor integrated element 4, that is, the surface of the semiconductor integrated element 4 facing the X-ray detection element 3. These electrodes are electrically connected to any of the circuit boards 9 through a bonding wire 43. A signal voltage is output from the bonding wire 43. The bias voltage applied to the bias electrode 33 through the bonding wire 42 is significantly higher than the signal voltage output from the bonding wire 43. As shown in FIG. 9, the extending direction of the bonding wire 42 and the extending direction of the bonding wires 43 in plan view cross each other. The bonding wire 42 and the bonding wire 43 do not overlap or cross each other in plan view. With such a configuration, it is possible to reduce the influence of the bias voltage on the signal voltage, that is, noise. The bonding wire 42 protrudes above the X-ray detection element 3. In order to avoid interference between the bonding wire 42 and the capillary plate 2, the back surface 22 of the capillary plate 2 and the front surface of the X-ray detection element 3, that is, the surface of the bias electrode 33, are spaced apart from each other as shown in FIG. 10. In one example, the distance between the back surface 22 and the front surface of the X-ray detection element 3 is in the range of 1 mm to 100 mm.

FIG. 1 is referred to again. The base member 6 is a plate-shaped or block-shaped member, and the X-ray detection element 3 and the semiconductor integrated element 4 are mounted on the base member 6. The base member 6 is formed of a material with high thermal conductivity. In one example, the base member 6 is formed of metal. In one embodiment, the base member 6 is formed of aluminum. The base member 6 has a mounting surface 61 and a back surface 62. The mounting surface 61 is a flat surface facing the back surface of the semiconductor integrated element 4. The back surface 62 is a flat surface facing away from the mounting surface 61. The mounting surface 61 is bonded to the back surface of the semiconductor integrated element 4 with an adhesive having good thermal conductivity. The adhesive is, for example, silver paste, copper paste, heat dissipation sheet, other materials, or a combination of two or more of these. A step is provided around the mounting surface 61. At least one circuit board 9 is arranged on a surface 63 that is one step lower than the mounting surface 61.

At least one of the plurality of circuit boards 9 is electrically connected to the semiconductor integrated element 4 through the bonding wire 43. Another circuit board 9 is electrically connected to another adjacent circuit board 9. A circuit for controlling the detection circuit 5, a circuit forming a part of the detection circuit 5, and the like are provided in these circuit boards 9. The circuit board 9 is, for example, a printed wiring board.

The heat sink 7 is provided to cool the semiconductor integrated element 4 by emitting heat generated in the semiconductor integrated element 4. The heat sink 7 has a top surface 71 and a plurality of fins 72. The top surface 71 faces the back surface 62 of the base member 6. The plurality of fins 72 protrude in a direction opposite to the direction in which the top surface 71 faces, and are arranged in a direction along the top surface 71. The heat sink 7 is formed of a material with high thermal conductivity. In one example, the heat sink 7 is formed of metal. The constituent material of the heat sink 7 may be the same as or different from that of the base member 6. The top surface 71 is bonded to the back surface 62 of the base member 6 through the Peltier element 8. The Peltier element 8 is driven by power supplied through a wiring (not shown). The Peltier element 8 transfers heat from the base member 6 to the heat sink 7.

The container 10 houses the capillary plate 2, the X-ray detection element 3, the semiconductor integrated element 4, the base member 6, the heat sink 7, the Peltier element 8, and the circuit board 9. The material of the container 10 is, for example, aluminum, iron, stainless steel, other materials, or a combination of two or more of these. The container 10 has at least two spaces 11 and 12 separated from each other. The space 11 is kept airtight and houses the capillary plate 2, the X-ray detection element 3, the semiconductor integrated element 4, the base member 6, and the circuit board 9. The space 12 communicates with the external space of the container 10 through a vent and houses the heat sink 7. The space 11 and the space 12 are separated from each other by a partition plate 13. The partition plate 13 has an opening 13a, and the Peltier element 8 is arranged in the opening 13a. The airtightness of the space 11 is maintained by the peripheral portion of the heat sink 7 being in contact with the partition plate 13.

A fan 16 is attached to a part of the wall surface defining the space 12 excluding the partition plate 13. The fan 16 sucks or exhausts air through an opening (not shown) provided in the wall surface. As a result, heat emitted from the heat sink 7 is emitted outside the container 10.

An opening 110 through which X-ray pass is formed in a part of the wall surface defining the space 11 excluding the partition plate 13. The container 10 further has a window member 14 that airtightly closes the opening 110 thereof. The window member 14 transmits X-ray directed toward the capillary plate 2. The material of the window member 14 is, for example, beryllium, aluminum, carbon, other materials, or a combination of two or more of these. The capillary plate 2 is fixed to the wall surface defining the space 11 with the back surface 22 supported by a support portion 15 of the container 10 so that the front surface 21 faces the window member 14.

The effect obtained by the X-ray detection device 1 according to the present embodiment described above will be described. As described above, in order to improve the image quality obtained by the X-ray detection element 3, the capillary plate 2 may be arranged so as to face the front surface of the X-ray detection element 3. By making the central axes of the plurality of X-ray passing regions 23 parallel to each other, only the parallel components of the X-ray can be made to pass through the X-ray passing regions 23 to improve the image quality. In this case, it has been generally believed that a clearer image can be obtained as the inner diameters of the plurality of X-ray passing regions 23 of the capillary plate 2 become smaller than the width of the pixel electrode portions B in the arrangement direction. However, the research by the inventors showed that this was not necessarily true. Between the pixel electrode portions B adjacent to each other, a gap for electrically insulating the pixel electrode portions B from each other is necessarily provided (see FIG. 5). The smaller the inner diameter of the X-ray passing region 23 of the capillary plate 2, the more frequently the X-ray passing region 23 is arranged on the gap. A plurality of carriers generated by the X-ray passing through the X-ray passing region 23 arranged on the gap are dispersed and collected in the two pixel electrode portions B located on both sides of the gap. This phenomenon is called charge share. As a result, the X-ray incidence position becomes ambiguous and the energy resolution is lowered, which is one of the causes of blurring of the image.

To address such a problem, in the X-ray detection device 1 according to the present embodiment, when charge share occurs, that is, when a plurality of carriers generated by incidence of X-ray are dispersed and collected in a plurality of pixel electrode portions B, the detection circuit 5 determines the pixel electrode portion B corresponding to the X-ray incidence position and corrects and evaluates the amount of carriers in the pixel electrode portion B or ignores the incidence of the X-ray. Therefore, it is possible to reduce the influence of carrier dispersion on the image. As a result, it is possible to improve the energy resolution and suppress blurring of an image due to charge share.

In addition, the excitation X-ray XR1 shown in FIG. 3 has higher energy than the fluorescent X-ray XR2. If the capillary plate 2 is not provided, the excitation X-ray XR1 is transmitted through the conversion portion 31 and reaches the bump 41 because of its high energy. Then, fluorescent X-ray are generated at the bump 41, and the fluorescent X-ray are absorbed by the conversion portion 31 to generate carriers. The carriers become noise to cause degradation of image visibility. In particular, when the L-ray energy of the material forming the bump 41 is in the range of several keV to 20 keV, there is a high possibility that the L-ray energy will overlap the energy of the fluorescent X-ray XR2 to be detected. By providing the capillary plate 2 as in the present embodiment, the excitation X-ray XR1 reaching the bump 41 can be greatly reduced, thereby suppressing the degradation of image visibility.

As in the present embodiment, the plurality of X-ray passing regions 23 of the capillary plate 2 may be arranged on a triangular lattice on the front surface 21 and the back surface 22. The plurality of pixel electrode portions B of the X-ray detection element 3 may be arranged side by side in the row and column directions on the back surface 31b. When the arrangement form of the plurality of X-ray passing regions 23 is different from the arrangement form of the plurality of pixel electrode portions B as described above, the frequency of arrangement of the X-ray passing regions 23 on the gap between the pixel electrode portions B is further increased. In such a case, the X-ray detection device 1 according to the present embodiment is particularly useful.

As in the present embodiment, the back surface 22 of the capillary plate 2 and the front surface of the X-ray detection element 3 may be spaced apart from each other with a gap interposed therebetween. As the distance of the capillary plate 2 from the X-ray detection element 3 increases, the extent to which the X-ray spread after passing through each X-ray passing region 23 increases. For this reason, the frequency of charge share increases. In such a case, the X-ray detection device 1 according to the present embodiment is particularly useful. In addition, since the capillary plate 2 is spaced apart from the X-ray detection element 3, the degree of freedom of arrangement of the capillary plate 2 and the X-ray detection element 3 can be increased.

As in the present embodiment, the central axes of the plurality of X-ray passing regions 23 may be parallel to each other. In this case, the X-ray passing through the capillary plate 2 can be collimated to improve the visibility of the X-ray image.

As in the present embodiment, the X-ray detection device 1 may include the container 10 that airtightly houses the capillary plate 2, the X-ray detection element 3, and the detection circuit 5. The container may have the window member 14 that transmits X-ray directed toward the capillary plate 2. In this case, it is possible to prevent dust from adhering to the capillary plate 2, the X-ray detection element 3, and the detection circuit 5. In particular, when the X-ray passing region 23 of the capillary plate 2 is a fine hole, it is difficult to remove dust entering the hole, leading to degradation of image quality. By providing the X-ray detection device 1 with the container 10 described above, it is possible to prevent dust from entering the hole. As a result, it is possible to maintain image quality. In addition, in order to prevent dust from entering the hole, the entire capillary plate 2 may be sealed with a material that allows X-ray transmission. The airtightness of the space 11 may be set such that dust does not enter the space 11. Depending on the case, the space 11 may not be airtight. Only the capillary plate 2 and its periphery in the space 11 may be airtight.

First Modification Example

FIG. 11 is a diagram schematically showing a configuration according to a first modification example of the embodiment described above. In the embodiment described above, the back surface 22 of the capillary plate 2 and the front surface of the X-ray detection element 3, that is, the surface of the bias electrode 33 are spaced apart from each other with a gap interposed therebetween. As shown in FIG. 11, the back surface 22 and the front surface of the X-ray detection element 3 may be bonded to each other with an adhesive 17. In this case, the capillary plate 2 and the X-ray detection element 3 are close to each other. Therefore, before the X-ray passing through each X-ray passing region 23 spread, the X-ray reach the conversion portion 31 of the X-ray detection element 3. Therefore, it is possible to reduce the charge share compared with a case where the back surface 22 and the front surface of the X-ray detection element 3 are spaced apart from each other with a gap interposed therebetween. In FIG. 11, the adhesive 17 is provided only immediately below the non-passing region 25 and is not provided immediately below the X-ray passing region 23. In this manner, it is possible to prevent incident X-ray from being absorbed by the adhesive 17. Therefore, even when the energy of incident X-ray is low, it is possible to suppress a decrease in the sensitivity of the X-ray detection device 1. The adhesive 17 is not limited to this form, and the adhesive 17 may be provided on the entire back surface 22 including immediately below the X-ray passing region 23 when the energy of incident X-ray is high.

Second Modification Example

Part (a) of FIG. 12 is a diagram schematically showing a configuration according to a second modification example of the embodiment described above. In the embodiment described above, the back surface 22 of the capillary plate 2 is supported by the support portion 15 of the container 10 (see FIG. 1). As shown in part (a) of FIG. 12, the support portion 15 of the container 10 may be fixed to the side 26 of the capillary plate 2 to support the capillary plate 2. In this case, compared with a case where the support portion 15 supports the back surface 22 of the capillary plate 2, the capillary plate 2 can be brought closer to the X-ray detection element 3 by the thickness of the support portion 15. Therefore, since the extent to which the X-ray spread after passing through each X-ray passing region 23 is reduced, it is possible to reduce the charge share. The support portion 15 and the side 26 of the capillary plate 2 can be fixed to each other by using, for example, resin.

Third Modification Example

Part (b) of FIG. 12 is a diagram schematically showing a configuration according to a third modification example of the embodiment described above. In the embodiment described above, the capillary plate 2 is fixed to the wall surface defining the space 11 by the support portion 15 (see FIG. 1). As shown in part (b) of FIG. 12, the X-ray detection device may include a support 18 instead of the support portion 15. The support 18 stands on the base member 6. The support 18 supports the back surface 22 or the side 26 of the capillary plate 2. The support 18 has, for example, a columnar shape or a cylindrical shape surrounding the X-ray detection element 3. The material of the support 18 is, for example, aluminum, iron, stainless steel, other materials, or a combination of two or more of these. The support 18 may be bonded to the base member 6 or may be integrally formed with the base member 6. In one example, the support 18 is arranged on a surface 63 that is one step lower than the mounting surface 61 of the base member 6. According to this modification example, the back surface 22 of the capillary plate 2 and the front surface of the X-ray detection element 3 can be easily brought close to each other in parallel. In other words, the center axis of the X-ray passing region 23 can be easily brought close to the front surface of the X-ray detection element 3 so as to be perpendicular thereto. Therefore, it is possible to obtain a clearer image. In order to make it easier to form the bonding wires 42 and 43, the capillary plate 2 and the support 18 may be detachable from each other, or the support 18 and the base member 6 may be detachable from each other.

Fourth Modification Example

FIG. 14 is a diagram schematically showing a configuration according to a fourth modification example of the embodiment described above. In the embodiment described above, the capillary plate 2 and the X-ray detection element 3 face each other in a one-to-one relationship. As shown in FIG. 14, a plurality of X-ray detection elements 3 may face one capillary plate 2. In this case, since a plurality of X-ray detection elements 3 are arranged side by side, it is possible to increase the area of the light receiving region by using the small X-ray detection element 3.

Fifth Modification Example

FIG. 13 is a diagram schematically showing a configuration according to a fifth modification example of the embodiment described above. In the embodiment described above, the capillary plate 2 and the X-ray detection element 3 face each other in a one-to-one relationship. As shown in FIG. 13, a plurality of capillary plates 2 may face one X-ray detection element 3. In this case, since a plurality of capillary plates 2 are arranged side by side, even if the manufacturing yield of the large-area capillary plate 2 is low, it is possible to manufacture the X-ray detection device with a high yield by using a plurality of small-area capillary plates 2.

Sixth Modification Example

FIG. 15 is a diagram schematically showing a configuration according to a sixth modification example of the embodiment described above. As shown in FIG. 15, a plurality of capillary plates 2 and a plurality of X-ray detection elements 3 may be arranged. In this case, as shown in part (a) of FIG. 15, a plurality of X-ray detection elements 3 may face one capillary plate 2. Alternatively, as shown in part (b) of FIG. 15, a plurality of capillary plates 2 may face one X-ray detection element 3. According to this modification example, it is possible to further increase the area of the light receiving region.

Seventh Modification Example

FIGS. 16 to 18 are diagrams schematically showing a configuration according to a seventh modification example of the embodiment described above. As in this modification example, the X-ray detection device may include a first element row 3A and a second element row 3B. Each of the first element row 3A and the second element row 3B includes two or more X-ray detection elements 3. Two or more X-ray detection elements 3 of the first element row 3A are arranged along a predetermined direction crossing the X-ray incidence direction. Two or more X-ray detection elements 3 of the second element row 3B are arranged along the first element row 3A. As shown in FIGS. 16 and 17, each X-ray detection element 3 of the first element row 3A and each X-ray detection element 3 of the second element row 3B may be alternately arranged. In this case, as shown in FIG. 16, the capillary plate 2 and the X-ray detection element 3 may face each other in a one-to-one relationship. Alternatively, as shown in FIG. 17, a plurality of X-ray detection elements 3 may face one capillary plate 2. As shown in FIG. 18, a plurality of capillary plates 2 on the first element row 3A and a plurality of capillary plates 2 on the second element row 3B may be alternately arranged. In this case, a plurality of capillary plates 2 may face one X-ray detection element 3. According to this modification example, when the X-ray detection device is used as a line sensor, it is possible to reduce or eliminate a dead area between the X-ray detection elements 3 that is mainly caused by providing the guard ring 34. In addition, when the X-ray detection device is used as a line sensor, it is possible to reduce or eliminate a dead area between the capillary plates 2 that is mainly caused by the non-passing region 25 of the capillary plate 2.

Eighth Modification Example

FIG. 19 is a side view of a capillary lens 2A according to an eighth modification example of the embodiment described above. FIG. 19 also shows an X-ray XR3 incident on the capillary lens 2A and an X-ray XR4 emitted from the capillary lens 2A. The capillary lens 2A is an example of a capillary in this modification example, and is provided instead of the capillary plate 2 in the embodiment described above. The capillary lens 2A has an approximately columnar shape. A cross section perpendicular to the central axis of the capillary lens 2A is a circle having its center on the central axis. The capillary lens 2A outputs the X-ray XR3 incident on one end surface 27 from a point-like X-ray source D2, as the X-ray XR4 that is parallel X-ray, from the other end surface 28. For this reason, the diameter of the capillary lens 2A gradually decreases toward the end surface 27 on the incidence side. The interval or pitch between the central axes of a plurality of X-ray passing regions in the capillary lens 2A is constant near the end surface 28 on the emission side, and the central axes of the plurality of X-ray passing regions are parallel to each other. The interval between the central axes of the plurality of X-ray passing regions gradually decreases toward the end surface 27 on the incidence side. Even when the X-ray detection device includes such a capillary lens 2A, it is possible to obtain the same function and effect as those of the embodiment described above. In addition, by using the capillary lens 2A instead of the capillary plate 2 of the embodiment described above, it is possible to capture a fluorescent X-ray image in an enlarged or reduced manner.

Ninth Modification Example

In the embodiment described above, when a plurality of carriers generated by the incidence of X-ray are dispersed and collected in two or more pixel electrode portions B, the detection circuit 5 determines the pixel electrode portion B in which the largest number of carriers are collected to be the pixel electrode portion B corresponding to the X-ray incidence position. The method of determining the pixel electrode portion B is not limited to this, and for example, the method of this modification example may be adopted. FIG. 20 is a diagram showing an example of the internal configuration of each pixel circuit $5a$ in this modification example. As shown in FIG. 20, the pixel circuit $5a$ includes a signal generator 51, current output portions $52a$ and $52b$, an adder 53, a comparator 54, a carrier input signal generator 55, a carrier input pattern determination portion 56, and a counter 57.

The signal generator 51 is electrically connected to the pixel electrode portion B corresponding to the pixel circuit $5a$ to which the signal generator 51 belongs among the plurality of pixel electrode portions B. In the following description, the pixel electrode portion B will be referred to as a self-electrode portion $B_0$. The signal generator 51 generates an input signal SP1 by performing charge-voltage conversion of carriers. The input signal SP1 has a voltage waveform having a magnitude corresponding to the number of carriers input from the self-electrode portion $B_0$ to the pixel circuit $5a$. When each pixel electrode portion B includes a plurality of electrodes b (see FIG. 6), the plurality of electrodes b are connected to the input terminal of one signal generator 51 as shown in part (a) of FIG. 21. Alternatively, as shown in part (b) of FIG. 21, a plurality of signal generators 51, the number of which is the same as the number of electrodes b, may be provided. Each of the plurality of electrodes b is connected to each of the plurality of signal generators 51.

The current output portion $52a$ is connected to the output terminal of the signal generator 51. The current output portion $52a$ receives the input signal SP1 from the signal generator 51. The current output portion $52a$ generates a current signal SC having a magnitude corresponding to the input signal SP1 that is a voltage signal. The current output portion $52a$ provides the current signal SC to the pixel circuit $5a$ connected to a specific pixel electrode portion B among the pixel electrode portions B arranged around the self-electrode portion $B_0$. In the following description, the pixel electrode portions B arranged around the self-electrode portion $B_0$ may be referred to as surrounding electrode portions.

Here, FIG. 22 is referred to. FIG. 22 is a diagram showing the self-electrode portion $B_0$ and eight surrounding electrode portions $B_1$ to $B_8$ surrounding the self-electrode portion $B_0$. In the example shown in FIG. 22, the surrounding electrode portions $B_1$ to $B_3$ are included in a row preceding the self-electrode portion $B_0$, the surrounding electrode portions $B_4$ and $B_5$ are included in the same row as the self-electrode portion $B_0$, and the surrounding electrode portions $B_6$ to $B_8$ are included in a row following the self-electrode portion $B_0$. In addition, the surrounding electrode portions $B_1$, $B_4$, and $B_6$ are included in a column preceding the self-electrode portion $B_0$, the surrounding electrode portions $B_2$ and $B_7$ are included in the same column as the self-electrode portion $B_0$, and the surrounding electrode portion $B_3$, $B_5$, and $B_8$ are included in a column following the self-electrode portion $B_0$. In this modification example, the current output portion $52a$ provides the current signal SC to the pixel circuits $5a$ connected to the surrounding electrode portions $B_1$, $B_2$, and $B_4$.

FIG. 20 is referred to again. The current output portion $52b$ is connected to the output terminal of the signal generator 51. The current output portion $52b$ receives the input signal SP1 from the signal generator 51. The current output portion $52b$ generates the current signal SC having a magnitude corresponding to the input signal SP1 that is a voltage signal. The current output portion $52b$ provides the current signal SC to the adder 53. The adder 53 is connected to the current output portions $52a$ of the three pixel circuits $5a$ connected to the specific electrode portions $B_5$, $B_7$, and $B_8$ among the surrounding electrode portions $B_1$ to $B_8$. The adder 53 receives the current signals SC from the current output portions $52a$ of the three pixel circuits $5a$. The adder 53 adds up the three provided current signals SC and the current signal SC provided from the current output portion $52b$ of the pixel circuit $5a$ to which the adder 53 belongs. The adder 53 generates a voltage signal SP2 having a magnitude corresponding to the current after addition. The voltage signal SP2 has a voltage waveform having a magnitude corresponding to the total number of carriers input to the self-electrode portion $B_0$ and the specific electrode portions $B_5$, $B_7$, and $B_8$. The specific electrode portions $B_5$, $B_7$, and $B_8$ are surrounding electrode portions that are considered to be included in the dispersion range of carriers caused by the incidence of X-ray when counting the number of photons of incident X-ray in each pixel circuit $5a$. The specific electrode portions $B_5$, $B_7$, and $B_8$ are arbitrarily determined in advance among the surrounding electrode portions $B_1$ to $B_8$. For example, among the plurality of pixel circuits $5a$, there is the pixel circuit $5a$ in which some of the specific electrode portions $B_5$, $B_7$, and $B_8$ for the self-electrode portion $B_0$ are not present because the self-electrode portion $B_0$ is located at the row end or the column end. In such a pixel circuit $5a$, the adder $53$ may not add the current signal SC from a specific electrode portion that is not present. For example, among the plurality of pixel circuits $5a$, there is the pixel circuit $5a$ in which none of the specific electrode portions $B_5$, $B_7$, and $B_8$ for the self-electrode portion $B_0$ are present because the self-electrode portion $B_0$ is located at the row end and the column end. In such a pixel circuit $5a$, the adder $53$ and subsequent circuit portions are not essential and can be omitted.

The comparator $54$ is connected to the output terminal of the adder $53$. The comparator $54$ receives the voltage signal SP2 from the adder $53$. The comparator $54$ determines whether or not the magnitude of the peak voltage of the voltage signal SP2 exceeds a predetermined threshold value. That is, the comparator $54$ determines whether or not carriers, the number of which corresponds to one or more photons to be measured, have been generated around the self-electrode portion $B_0$. When the magnitude of the peak voltage of the voltage signal SP2 exceeds the predetermined threshold value, the comparator $54$ outputs a significant value, such as High level, as a determination result signal S1. When the magnitude of the peak voltage of the voltage signal SP2 does not exceed the predetermined threshold value, the comparator $54$ outputs a non-significant value, such as Low level, as the determination result signal S1.

The carrier input signal generator $55$ is connected to the output terminal of the signal generator $51$. The carrier input signal generator receives the input signal SP1 from the signal generator $51$. When the input signal SP1 exceeding a predetermined threshold value is input, the carrier input signal generator $55$ outputs a significant value, such as High level, as a carrier input signal S2 in order to indicate that there has been a carrier input to the self-electrode portion $B_0$. The threshold value is, for example, a value slightly larger than the noise level. When the input signal SP1 that does not exceed the threshold value is input, the carrier input signal generator $55$ outputs a non-significant value, such as Low level, as the carrier input signal S2. The carrier input signal S2 is provided to the seven pixel circuits $5a$ respectively connected to the surrounding electrode portions $B_2$ to $B_8$.

The carrier input pattern determination portion $56$ receives the carrier input signals S2 from the seven pixel circuits $5a$ respectively connected to the surrounding electrode portions $B_1$ to $B_7$. The carrier input pattern determination portion $56$ determines whether or not the carrier input pattern matches any of the plurality of determination patterns based on the carrier input signals S2. The carrier input pattern indicates, for each electrode, whether or not carriers are input to the self-electrode portion $B_0$ and the surrounding electrode portions $B_1$ to $B_7$. In the carrier input pattern, it is patterned to which pixel electrode portion B, among the self-electrode portion $B_0$ and the surrounding electrode portions $B_1$ to $B_8$, carriers are input. When the carrier input pattern matches any one of the plurality of determination patterns and a significant value such as High level is input as the determination result signal S1, the carrier input pattern determination portion $56$ outputs a significant value, such as High level, as a determination signal S3. When the carrier input pattern does not match any of the plurality of determination patterns and/or when a non-significant value such as Low level is input as the determination result signal S1, the carrier input pattern determination portion $56$ outputs a non-significant value, such as Low level, as the determination signal S3. In the counter $57$, when the carrier input pattern determination portion $56$ determines that the carrier input pattern matches any of the plurality of determination patterns and the magnitude of the peak voltage of the voltage signal SP2 exceeds the predetermined threshold value, that is, when the determination signal S3 is a significant value such as High level, addition of the number of X-ray photons is performed. In this modification example, whether or not carriers are incident on the surrounding electrode portion $B_8$ does not affect the determination. Therefore, the carrier input pattern determination portion $56$ does not need to receive the carrier input signal S2 from the pixel circuit $5a$ connected to the surrounding electrode portion $B_8$. In this modification example, one counter $57$ is provided for each pixel electrode portion B. Only one counter $57$ may be provided for two or more pixel electrode portions B.

FIG. $23$ is referred to. Part (a) to part (j) of FIG. $23$ are diagrams showing ten determination patterns P1 to P10 as examples of a plurality of determination patterns set in the carrier input pattern determination portion $56$. In FIG. $23$, "H" is written in the pixel electrode portion corresponding to the pixel circuit $5a$ to which the carrier input signal S2 is output, that is, to which carriers are input. The self-electrode portion $B_0$ and the specific electrode portions $B_5$, $B_7$, and $B_8$ are indicated by bold frames for easy understanding of the determination patterns P1 to P10. Reference numerals of the self-electrode portion $B_0$ and the surrounding electrode portions $B_1$ to $B_7$ are shown only in part (a) of FIG. $23$, and are omitted in part (b) to part (j) of FIG. $23$. The carrier input pattern determination portion $56$ may be configured by combining a plurality of logic circuits. In this case, the plurality of combined logic circuits determine validity according to the combination of the carrier input signals S2 from the surrounding electrode portions $B_1$ to $B_7$ and the carrier input signal S2 of the self-electrode portion $B_0$. Therefore, the carrier input pattern determination portion $56$ determines whether or not the carrier input pattern matches any of the plurality of determination patterns, for example, the determination patterns P1 to P10. The detection circuit $5$ may include a memory that stores a plurality of determination patterns, for example, the determination patterns P1 to P10. In this case, the carrier input pattern determination portion $56$ determines whether or not any of the plurality of determination patterns stored in the memory matches the carrier input pattern. When the carrier input pattern determination portion $56$ is configured by combining a plurality of logic circuits, a physical configuration such as a memory becomes unnecessary, and the configuration of the detection circuit $5$ can be simplified.

The ten determination patterns P1 to P10 shown in FIG. $23$ are defined according to several rules. The carrier input pattern when carriers are input to the pixel electrode portions $B_1$ to $B_4$ and $B_6$ other than the specific electrode portions $B_5$, $B_7$ and $B_8$ among the surrounding electrode portions $B_1$ to $B_8$ does not match any of the determination patterns P1 to P10. In other words, the determination patterns P1 to P10 do not include a pattern corresponding to the carrier input pattern when carriers are input to any of the surrounding electrode portions $B_1$ to $B_3$ included in one row (a preceding row in this modification example) of the rows preceding and following the row including the self-electrode portion $B_0$ and the surrounding electrode portions $B_1$, $B_4$, and $B_6$ included in one column (a preceding column in this modification example) of the columns preceding and following the column including the self-electrode portion $B_0$. Therefore, when carriers are input to any of the surrounding electrode portions $B_1$ to $B_4$ and $B_6$, the carrier input pattern determination portion $56$ of the pixel circuit $5a$ connected to the self-electrode portion $B_0$ determines that the carrier input pattern does not match any of the plurality of determination patterns P1 to P10. When carriers are input to any of the surrounding electrode portions $B_1$ to $B_4$ and $B_6$, in the pixel circuit 5a connected to any pixel electrode portion B other than the self-electrode portion $B_0$, the determination patterns P1 to P10 are set such that the carrier input pattern necessarily matches any of the determination patterns P1 to P10. Therefore, by setting the determination patterns P1 to P10 according to the determination rules described above, it is possible to appropriately avoid adding the number of photons in a plurality of pixel circuits 5a for the incidence of one photon. In order to easily understand the determination patterns P1 to P10, the surrounding electrode portions $B_1$ to $B_4$ and $B_6$ are marked with x. From the pixel circuits 5a connected to the surrounding electrode portions $B_1$ to $B_4$ and $B_6$ marked with x, the carrier input signal S2 of "Low", which is the same as that of a blank pixel, is output in practice. As in this modification example, the determination rules are effective when the surrounding electrode portions $B_5$, $B_7$, and $B_8$, which are included in neither one row (a preceding row in this modification example) of the rows preceding and following the row including the self-electrode portion $B_0$ nor one column (a preceding column in this modification example) of the columns preceding and following the column including the self-electrode portion $B_0$, are specific electrodes.

The determination patterns P1 to P10 include patterns corresponding to all carrier input patterns when carriers are input to at least one surrounding electrode portion of the surrounding electrode portions $B_5$ and $B_7$, which are included in neither one row (a preceding row in this modification example) of the rows preceding and following the row including the self-electrode portion $B_0$ nor one column (a preceding column in this modification example) of the columns preceding and following the column including the self-electrode portion $B_0$ and which are included in a row or column including the self-electrode portion $B_0$, and carriers are input to the self-electrode portion $B_0$. In other words, the carrier input pattern when carriers are input to at least one specific electrode portion of the specific electrode portions $B_5$ and $B_7$ included in the row or column including the self-electrode portion $B_0$ and carriers are input to the self-electrode portion $B_0$ necessarily matches any of the plurality of determination patterns P1 to P10. Specifically, all patterns when carriers are input to the surrounding electrode portion $B_5$ and the self-electrode portion $B_0$ are represented by the determination patterns P2, P5, P7, and P8. All patterns when carriers are input to the surrounding electrode portion $B_7$ and the self-electrode portion $B_0$ are represented by determination patterns P3, P6, P7, and P8. By setting the determination patterns according to such determination rules, it is possible to appropriately determine whether or not the number of X-ray photons can be added in the pixel circuit 5a.

The determination patterns P1 to P10 include a pattern corresponding to the carrier input pattern when carriers are input to the surrounding electrode portion $B_5$, which are not included in one column (a preceding column in this modification example) of the columns preceding and following the row including the self-electrode portion $B_0$, and carriers are input to the surrounding electrode portion $B_7$, which are not included in one row (a preceding row in this modification example) of the rows preceding and following the row including the self-electrode portion $B_0$, and no carriers are input to the self-electrode portion $B_0$. Specifically, all patterns in which carriers are input to both the surrounding electrode portions $B_5$ and $B_7$ and no carriers are input to the self-electrode portion $B_0$ are represented by the determination patterns P9 and P10. By setting the determination patterns according to such determination rules, it is possible to appropriately determine whether or not the number of X-ray photons can be added in the pixel circuit 5a. The determination patterns P1 to P10 include a determination pattern P1 when carriers are input only to the self-electrode portion $B_0$ with little influence of charge share.

According to this modification example, when a plurality of carriers generated by incidence of X-ray are dispersed and collected in two or more pixel electrode portions B, the detection circuit 5 can determine the pixel electrode portion B corresponding to the X-ray incidence position and correct and evaluate the amount of carriers in the pixel electrode portion B. The details of this modification example are described in Patent Literature 2.

The X-ray detection device according to the present disclosure is not limited to the embodiment described above, and various modifications can be made. For example, the embodiment and each modification example described above may be combined according to the desired purpose and effect. In the embodiment described above, the form is exemplified in which a plurality of X-ray passing regions 23 of the capillary plate 2 are arranged on a triangular lattice and a plurality of pixel electrode portions B of the X-ray detection element 3 are arranged side by side in the row and column directions. The arrangement form of the X-ray passing regions 23 and the pixel electrode portions B is not limited to these. For example, the X-ray passing regions 23 and the pixel electrode portions B may have the same arrangement form. For example, both the X-ray passing regions 23 and the pixel electrode portions B may be arranged on a triangular lattice, or both the X-ray passing regions 23 and the pixel electrode portions B may be arranged in the row and column directions.

REFERENCE SIGNS LIST

1: X-ray detection device, 2: capillary plate, 2A: capillary lens, 3: X-ray detection element, 3A: first element row, 3B: second element row, 4: semiconductor integrated element, 5: detection circuit, 5a: pixel circuit, 6: base member, 7: heat sink, 8: peltier element, 9: circuit board, container, 11, 12: space, 13: partition plate, 13a: opening, 14: window member, 15: support portion, 16: fan, 17: adhesive, 18: support, 21: front surface (first surface), 22: back surface (second surface), 23: X-ray passing region, 24: X-ray shielding region, 25: non-passing region, 26: side, 27, 28: end surface, 31: conversion portion, 31a: front surface, 31b: back surface, 31c: side, 33: bias electrode, 34: guard ring, 41: bump, 42, 43: bonding wire, 51: signal generator, 52a, 52b: current output portion, 53: adder, 54: comparator, 55: carrier input signal generator, 56: carrier input pattern determination portion, 57: counter, 61: mounting surface, 62: back surface, 71: top surface, 72: fin, 110: opening, A: dark current, B: pixel electrode portion, b: electrode, $B_0$: self-electrode portion, $B_1$ to $B_8$: surrounding electrode portion, C: object, D1, D2: X-ray source, S1: determination result signal, S2: carrier input signal, S3: determination signal, SC: current signal, SP1: input signal, SP2: voltage signal, XR, XR3, XR4: X-ray, XR1: excitation X-ray, XR2: fluorescent X-ray.

The invention claimed is:

1. An X-ray detection device, comprising:
   at least one capillary having a first surface, a second surface facing away from the first surface, a plurality of X-ray passing regions, and an X-ray shielding region, the plurality of X-ray passing regions penetrating from the first surface to the second surface and the X-ray shielding region being arranged between the plurality of X-ray passing regions;

at least one X-ray detection element having a conversion portion and a plurality of pixel electrode portions, the conversion portion having a third surface facing the second surface of the capillary and a fourth surface facing away from the third surface, the conversion portion absorbing X-ray to generate carriers, and the plurality of pixel electrode portions being arranged in a two-dimensional manner on the fourth surface; and a detection circuit for detecting carriers collected from the conversion portion through the plurality of pixel electrode portions, the detection circuit having a plurality of pixel circuits, each pixel circuit of the plurality of pixel circuits corresponding to one of the plurality of pixel electrode portions, each of the plurality of pixel circuits including a circuit element that compares an amount of carriers collected through the pixel electrode portion with a threshold value and outputs a signal indicating comparison result to adjacent pixel circuits of the plurality of pixel circuits;

a heat-radiating member provided on the side opposite to the capillary with respect to the detection circuit; and a container that houses the capillary, the at least one X-ray detection element, and the detection circuit, and the heat-radiating member, wherein an inner diameter of each of the X-ray passing regions when viewed from an X-ray incidence direction is smaller than a width of each of the pixel electrode portions in an arrangement direction when viewed from the same direction, each pixel circuit of the plurality of pixel circuits determines, based on the signals in each pixel circuit of the plurality of pixel circuits and the adjacent pixel circuits, whether or not a plurality of carriers generated by incidence of an X-ray are dispersed and collected in a corresponding electrode portion of the plurality of pixel electrode portions and one or more surrounding electrode portions of the plurality of pixel electrode portions, and when the plurality of carriers generated by incidence of the X-ray are dispersed and collected in two or more of the pixel electrode portions, each of the plurality of pixel circuits determines one pixel electrode portion corresponding to an X-ray incidence position among the plurality of pixel electrode portions and corrects and evaluates an amount of carriers in the one pixel electrode portion or ignores the incidence of the X-ray.

2. The X-ray detection device according to claim 1, wherein the plurality of X-ray passing regions of the capillary are arranged on a triangular lattice on the first surface and the second surface, and the plurality of pixel electrode portions of the X-ray detection element are arranged side by side in a row direction and a column direction on the fourth surface.

3. The X-ray detection device according to claim 1, wherein the second surface and the third surface are spaced apart from each other with a gap interposed therebetween.

4. The X-ray detection device according to claim 1, wherein the second surface and the third surface are bonded to each other with an adhesive.

5. The X-ray detection device according to claim 1, wherein central axes of the plurality of X-ray passing regions are parallel to each other.

6. The X-ray detection device according to claim 1, wherein the container has a window member that transmits an X-ray directed toward the capillary.

7. The X-ray detection device according to claim 1, further comprising:

a support portion fixed to a side of the capillary to support the capillary.

8. The X-ray detection device according to claim 1, further comprising:

a base member on which the X-ray detection element is mounted; and a support that stands on the base member and supports the capillary.

9. The X-ray detection device according to claim 1, wherein the detection circuit is built in a semiconductor integrated element, the fourth surface of the at least one X-ray detection element faces the semiconductor integrated element, and each of the pixel electrode portions is connected to the semiconductor integrated element through a metal bump.

10. The X-ray detection device according to claim 1, wherein a plurality of X-ray detection elements, each of which is the at least one X-ray detection element, face one of the at least one capillary.

11. The X-ray detection device according to claim 1, wherein a plurality of capillaries, each of which is the at least one capillary, face one of the at least one X-ray detection element.

12. The X-ray detection device according to claim 1, further comprising:

a first element row including two or more of X-ray detection elements, each of which is the at least one X-ray detection element, arranged in a predetermined direction; and a second element row including two or more of X-ray detection elements, each of which is the at least one X-ray detection element, arranged along the first element row, wherein each of the X-ray detection elements of the first element row and each of the X-ray detection elements of the second element row are alternately arranged.

13. The X-ray detection device according to claim 1, wherein the at least one capillary and the at least one X-ray detection element face each other in a one-to-one relationship.

14. The X-ray detection device according to claim 1, wherein the detection circuit determines a pixel electrode portion in which the largest number of carriers are collected to be the one pixel electrode portion.

15. The X-ray detection device according to claim 14, wherein the detection circuit evaluates sum of the carriers collected in the one pixel electrode portion and pixel electrode portions surrounding the one pixel electrode portion as the amount of carriers in the one pixel electrode portion.

16. The X-ray detection device according to claim 1, wherein the detection circuit ignores the incidence of the X-ray if two or more pixel electrode portions in which carriers of an amount exceeding the threshold value are collected are present at a same time among the plurality of pixel electrode portions.

* * * * *